(12) United States Patent
Yamazaki

(10) Patent No.: US 7,551,471 B2
(45) Date of Patent: Jun. 23, 2009

(54) MEMORY ELEMENT AND SEMICONDUCTOR DEVICE

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 177 days.

(21) Appl. No.: 11/790,347

(22) Filed: Apr. 25, 2007

(65) Prior Publication Data
US 2007/0285959 A1 Dec. 13, 2007

(30) Foreign Application Priority Data
Apr. 28, 2006 (JP) .............................. 2006-125238

(51) Int. Cl.
*G11C 13/04* (2006.01)
(52) U.S. Cl. ................. 365/108; 365/129; 365/189.011; 365/189.08
(58) Field of Classification Search ................. 365/108, 365/129, 189.011, 189.08
See application file for complete search history.

(56) References Cited

U.S. PATENT DOCUMENTS

| | | | |
|---|---|---|---|
| 4,954,985 A | 9/1990 | Yamazaki | |
| 6,528,815 B1 | 3/2003 | Brown et al. | |
| 6,723,396 B1 | 4/2004 | Patrick | |
| 6,858,270 B2 | 2/2005 | Patrick | |
| 6,950,331 B2 | 9/2005 | Yang et al. | |
| 2006/0246643 A1 | 11/2006 | Ohsawa | |
| 2007/0153565 A1* | 7/2007 | Nomura et al. | 365/148 |
| 2008/0123396 A1* | 5/2008 | Kato et al. | 365/163 |

FOREIGN PATENT DOCUMENTS

| | | |
|---|---|---|
| JP | 2002-026277 | 1/2002 |
| JP | 2004-006271 | 1/2004 |
| JP | 2004-179249 | 6/2004 |
| WO | WO-2005/096380 | 10/2005 |

OTHER PUBLICATIONS

Möller. S et al., "A polymer/semiconductor write-once read-many-times memory", Nature, Nov. 13, 2003, vol. 426, pp. 166-169.

* cited by examiner

*Primary Examiner*—Pho M. Luu
(74) *Attorney, Agent, or Firm*—Eric J. Robinson; Robinson Intellectual Property Law Office, P.C.

(57) ABSTRACT

The memory element includes a first conductive layer, a second conductive layer, a layer containing a compound which can exhibit liquid crystallinity which is interposed between the first conductive layer and the second conductive layer, and a layer containing an organic compound which is interposed between the first conductive layer and the second conductive layer and is in contact with the layer containing the compound which can exhibit liquid crystallinity. The layer containing the compound which can exhibit liquid crystallinity is formed in contact with the first conductive layer and is a layer which transfers at least from a first phase to a second phase.

13 Claims, 16 Drawing Sheets

FIG. 2A
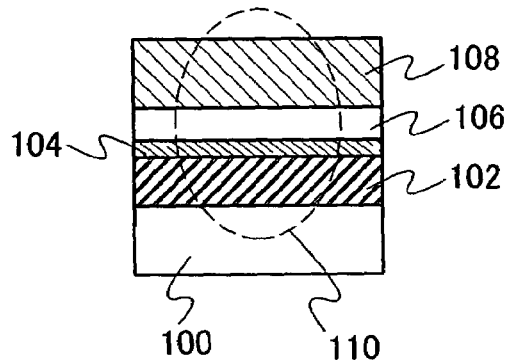
FIG. 2B1
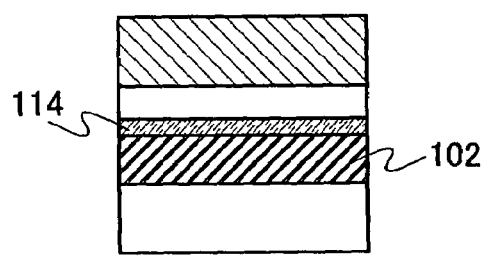
FIG. 2B2
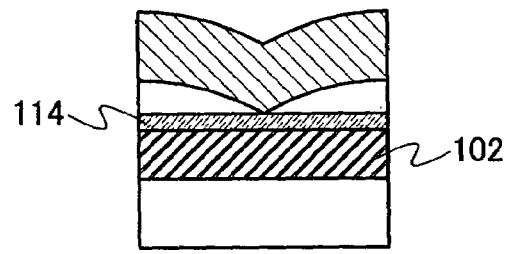
FIG. 2C1
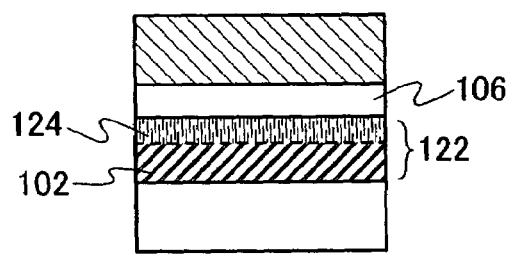
FIG. 2C2
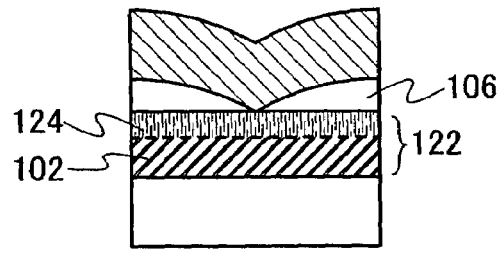

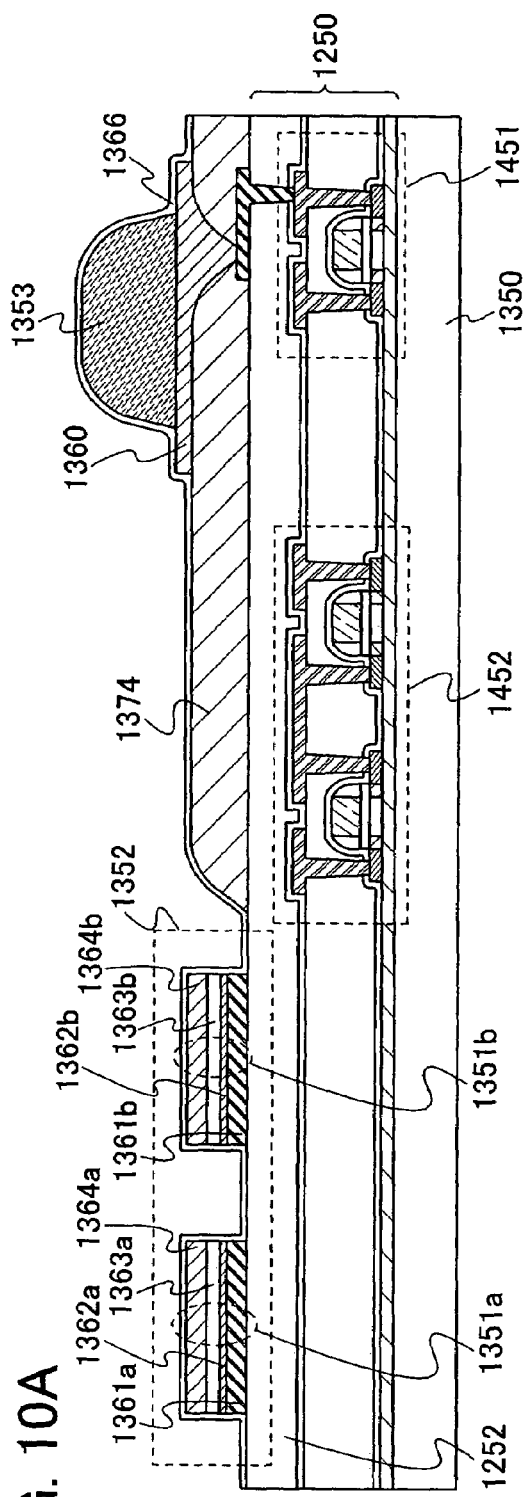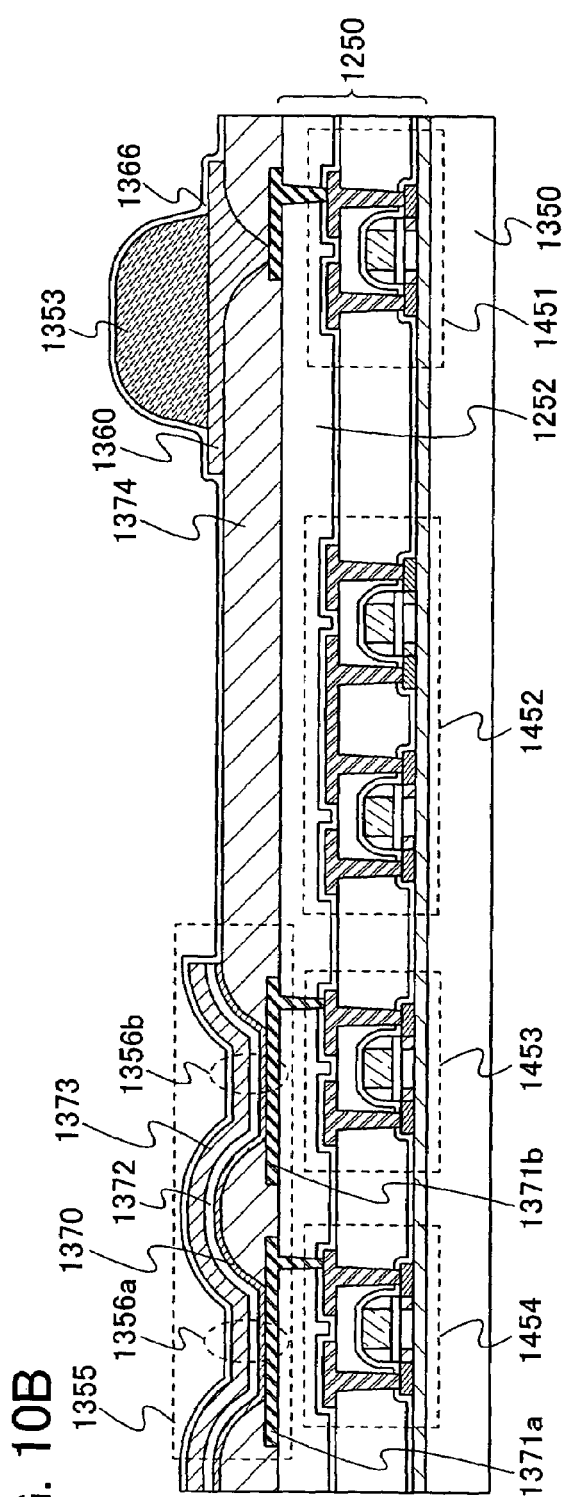

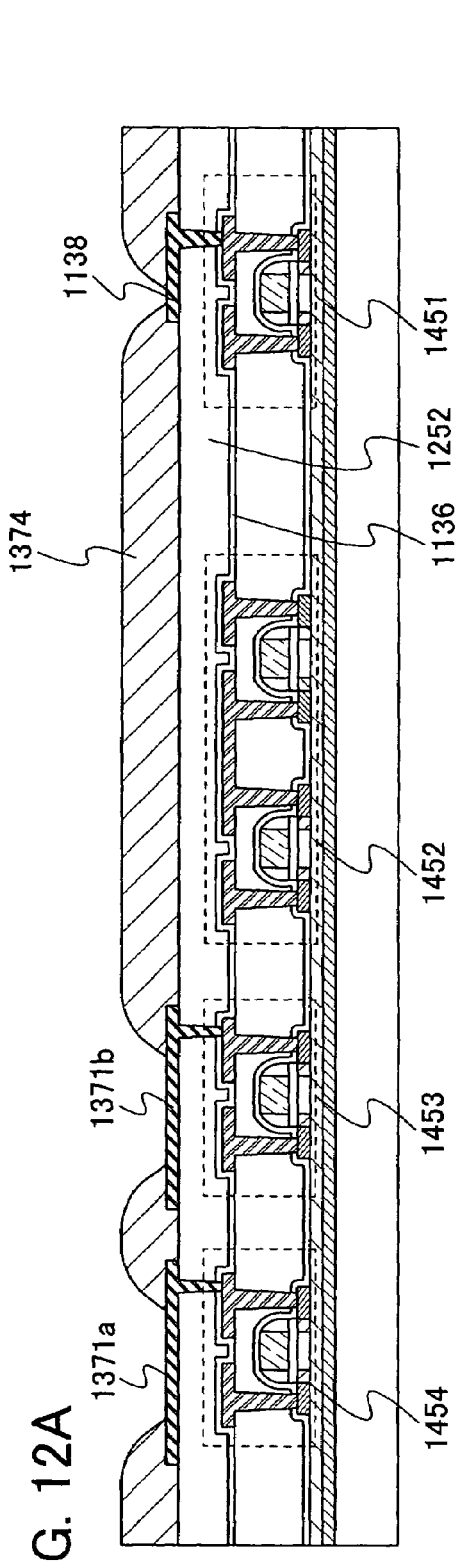
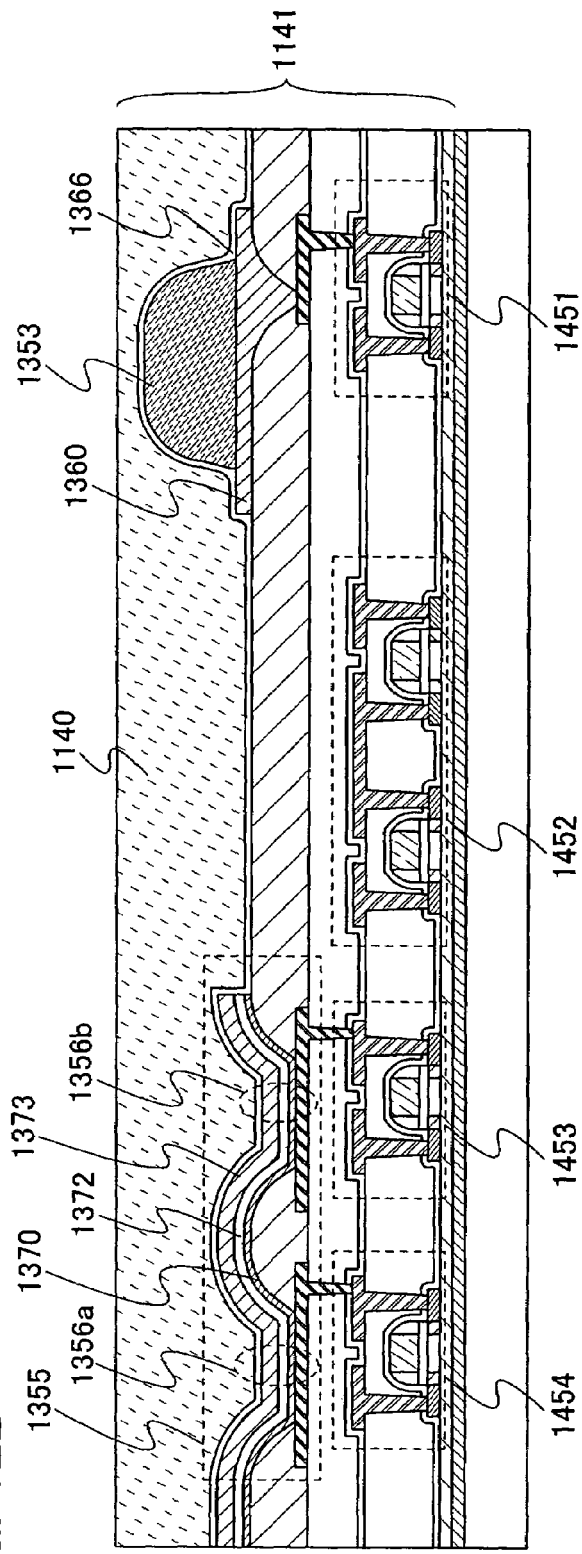
FIG. 12A
FIG. 12B

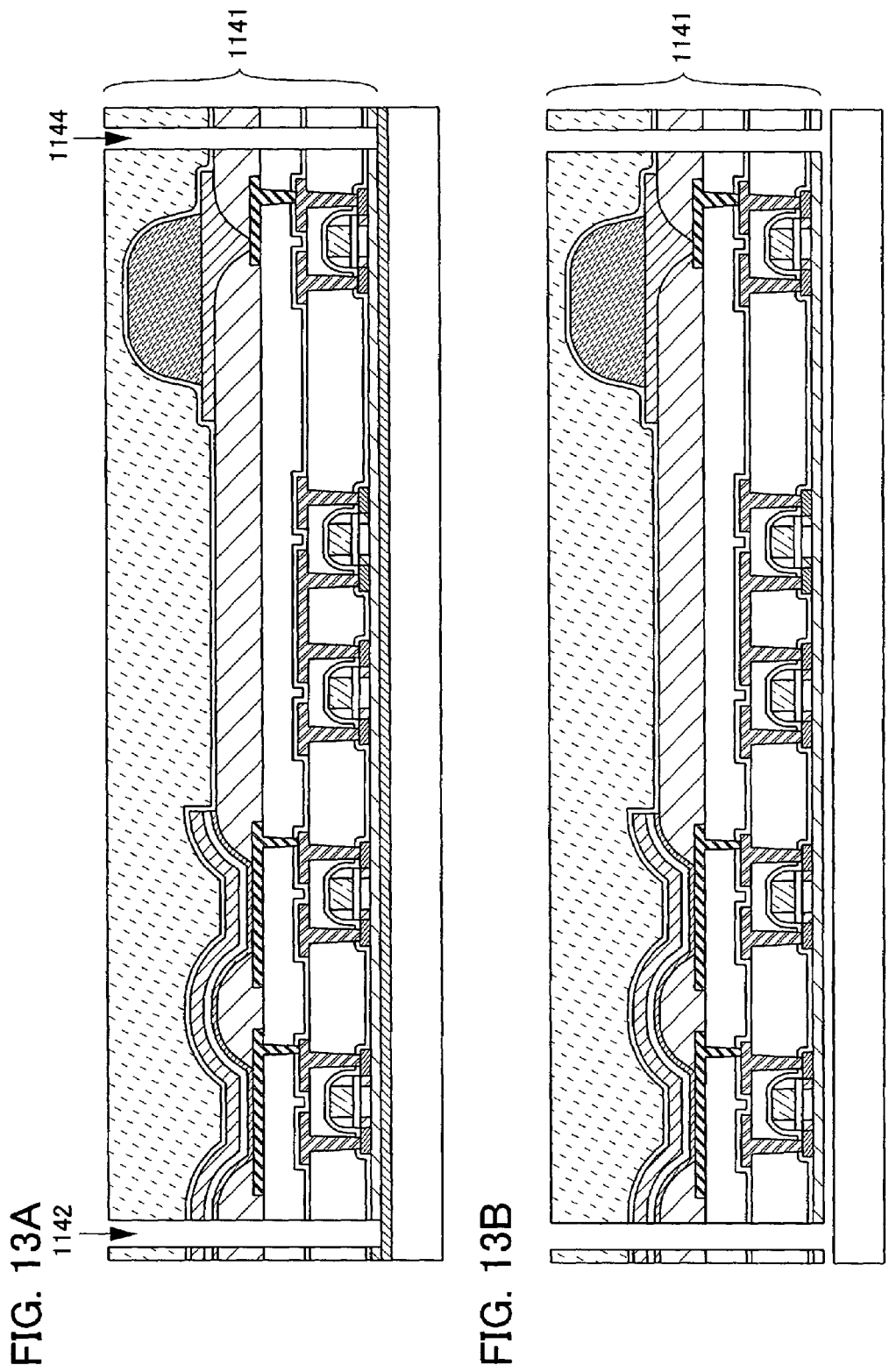

MEMORY ELEMENT AND SEMICONDUCTOR DEVICE

BACKGROUND OF THE INVENTION

1. Field of the Invention

The present invention relates to memory elements and semiconductor devices including the memory elements.

2. Description of the Related Art

In recent years, development has been advanced on a semiconductor device having various functions in which a plurality of circuits are integrated over an insulating surface. Further, development has been advanced on a semiconductor device which can send and receive data wirelessly by provision of an antenna. Such a semiconductor device is referred to as a wireless chip (also referred to as an ID tag, an IC tag, an RF (Radio Frequency) tag, a wireless tag, an electronic tag, or an RFID (Radio Frequency Identification) tag), and has already been introduced into some markets.

Many of semiconductor devices that are currently in practical use have circuits using semiconductor substrates of Si or the like (the circuits are also referred to as IC (Integrated Circuit) chips) and antennas, and the IC chip includes a memory circuit (also called a memory), a controlling circuit, and the like. In particular, a more highly-functional and higher value-added semiconductor device can be provided when a memory circuit capable of storing a large amount of data is provided. Moreover, it has been demanded to manufacture these semiconductor devices at low cost. In recent years, development has been conducted on an organic memory or the like which uses an organic compound in a memory circuit or the like (for example, see Reference 1: S. Moller and four others, NATURE, Vol 426, p 166-199 (2003)).

SUMMARY OF THE INVENTION

However, in the case of providing a layer containing an organic compound between a pair of electrodes as in Reference 1 and when the layer containing an organic compound is formed thinly in order to decrease writing voltage, a short circuit is likely to occur in an initial state between the electrodes. Further, a semiconductor device including such a memory element causes an initial defect.

A memory circuit which is generally provided for a semiconductor device is, for example, a DRAM (Dynamic Random Access Memory), an SRAM (Static Random Access Memory), an FeRAM (Ferroelectric Random Access Memory), a mask ROM (Read Only Memory), an EPROM (Electrically Programmable Read Only Memory), an EEPROM (Electrically Erasable and Programmable Read Only Memory), a flash memory, or the like. Among them, since the DRAM and the SRAM are volatile memory circuits in which data is erased when the power is turned off, data need to be written every time the power is turned on. Meanwhile, the FeRAM is a nonvolatile memory circuit. However, since the FeRAM uses a capacitor element including a ferroelectric layer, the number of manufacturing steps increases. Although the mask ROM has a simple structure, data need to be written in the manufacturing process and data cannot be additionally recorded. The EPROM, the EEPROM, and the flash memory are nonvolatile memory circuits; however, the number of manufacturing steps increases because an element including two gate electrodes is used.

In view of the above problems, it is an object of the present invention to provide a memory element with reduced initial defects and a semiconductor device including the memory element. Further, it is another object of the present invention to provide a nonvolatile memory element and a semiconductor device including the memory element in which additional recording of data at a time other than a manufacturing process is possible and forgery caused by rewriting of data can be prevented.

In order to solve the above-described problems, one feature of a memory element of the present invention is to include a first conductive layer; a second conductive layer; a layer containing a compound which can exhibit liquid crystallinity, which is interposed between the first conductive layer and the second conductive layer; and a layer containing an organic compound, which is interposed between the first conductive layer and the second conductive layer and is in contact with the layer containing the compound which can exhibit liquid crystallinity, in which the layer containing the compound which can exhibit liquid crystallinity is formed in contact with the first conductive layer and is a layer which transfers at least from a first phase to a second phase.

Another structure of the memory element of the present invention has a feature in which the layer containing the compound which can exhibit liquid crystallinity transfers from the first phase to the second phase by temperature change caused by application of voltage between the first conductive layer and the second conductive layer.

Another structure of the memory element of the present invention has a feature in which the first phase of the layer containing the compound which can exhibit liquid crystallinity is a solid state, and the second phase is a liquid crystal state or a liquid state. Note in this specification that the compound which can exhibit liquid crystallinity means a compound which can be in a liquid crystal state by phase transition. Therefore, the compound which can exhibit liquid crystallinity includes a compound which is in a solid state or a liquid state and which can become liquid crystal by phase transition.

Another structure of the memory element of the present invention has a feature in which the layer containing the organic compound is a layer containing an organic resin, a layer containing an organic compound having a hole transporting property, or a layer containing an organic compound having an electron transporting property.

One feature of a semiconductor device of the present invention is to include a memory cell array in which a plurality of memory cells are provided in matrix; and a writing circuit which selects at least one of the plurality of memory cells and writes data thereto and a reading circuit which selects at least one of the plurality of memory cells and reads data therefrom, in which at least a memory element is provided in each of the plurality of memory cells; and the memory element includes a layer containing a compound which can exhibit liquid crystallinity, which is interposed between a pair of conductive layers and is in contact with one of the conductive layers and a layer containing an organic compound, which is interposed between the pair of conductive layers and is in contact with the layer containing the compound which can exhibit liquid crystallinity.

Another feature of the semiconductor device of the present invention is to include a memory cell array in which a plurality of memory cells are provided in matrix; and a writing circuit which selects at least one of the plurality of memory cells and writes data thereto and a reading circuit which selects at least one of the plurality of memory cells and reads data therefrom, in which at least a memory element and a transistor connected to the memory element are provided in each of the plurality of memory cells; and the memory element includes a layer containing a compound which can exhibit liquid crystallinity, which is interposed between a pair of conductive layers and is in contact with one of the conductive layers and a layer containing an organic compound, which is interposed between the pair of conductive layers and is in contact with the layer containing the compound which can exhibit liquid crystallinity.

Another structure of the semiconductor device of the present invention has a feature in which the layer containing the compound which can exhibit liquid crystallinity is a layer which transfers from a solid state to a liquid state or a liquid crystal state by temperature change caused by application of voltage between the pair of conductive layers.

Another structure of the semiconductor device of the present invention has a feature in which the layer containing the organic compound is a layer containing an organic resin, a layer containing an organic compound having a hole transporting property, or a layer containing an organic compound having an electron transporting property.

Another structure of the semiconductor device of the present invention has a feature that the memory cell array, the writing circuit for writing the data, and the reading circuit for reading the data are provided over a glass substrate.

By the present invention, a memory element with reduced initial defects and a semiconductor device including the memory element are obtained. Accordingly, yield of the memory element and the semiconductor device including the memory element can be improved.

In addition, the present invention can provide a memory element and a semiconductor device including the memory element in which writing at a time other than a manufacturing process (additional recording) of data is possible and forgery caused by rewriting of data can be prevented.

BRIEF DESCRIPTION OF DRAWINGS

In the accompanying drawings:

FIGS. 2A to 2C2 are schematic diagrams showing the present invention;

FIGS. 10A and 10B show examples of a semiconductor device of the present invention;

FIGS. 12A and 12B show an example of a manufacturing method of a semiconductor device of the present invention;

FIGS. 13A and 13B show an example of a manufacturing method of a semiconductor device of the present invention;

DETAILED DESCRIPTION OF THE INVENTION

Hereinafter, the embodiment modes of the present invention will be described with reference to the drawings. Note that the present invention can be carried out in many various modes. It is easily understood by those skilled in the art that various changes may be made in forms and details without departing from the spirit and the scope of the present invention. Therefore, the present invention should not be limited to the description of the embodiment modes below.

EMBODIMENT MODE 1

One example of a memory element of the present invention will be described with reference to FIG. 1 and FIGS. 2A to 2C2. The memory element of the present invention has a structure which includes a layer containing an organic compound (hereinafter also referred to as an organic compound layer) and a layer containing a compound which can exhibit liquid crystallinity (hereinafter also referred to as a liquid crystal layer) which is in contact with the organic compound layer, between a pair of conductive layers.

Figure 1:
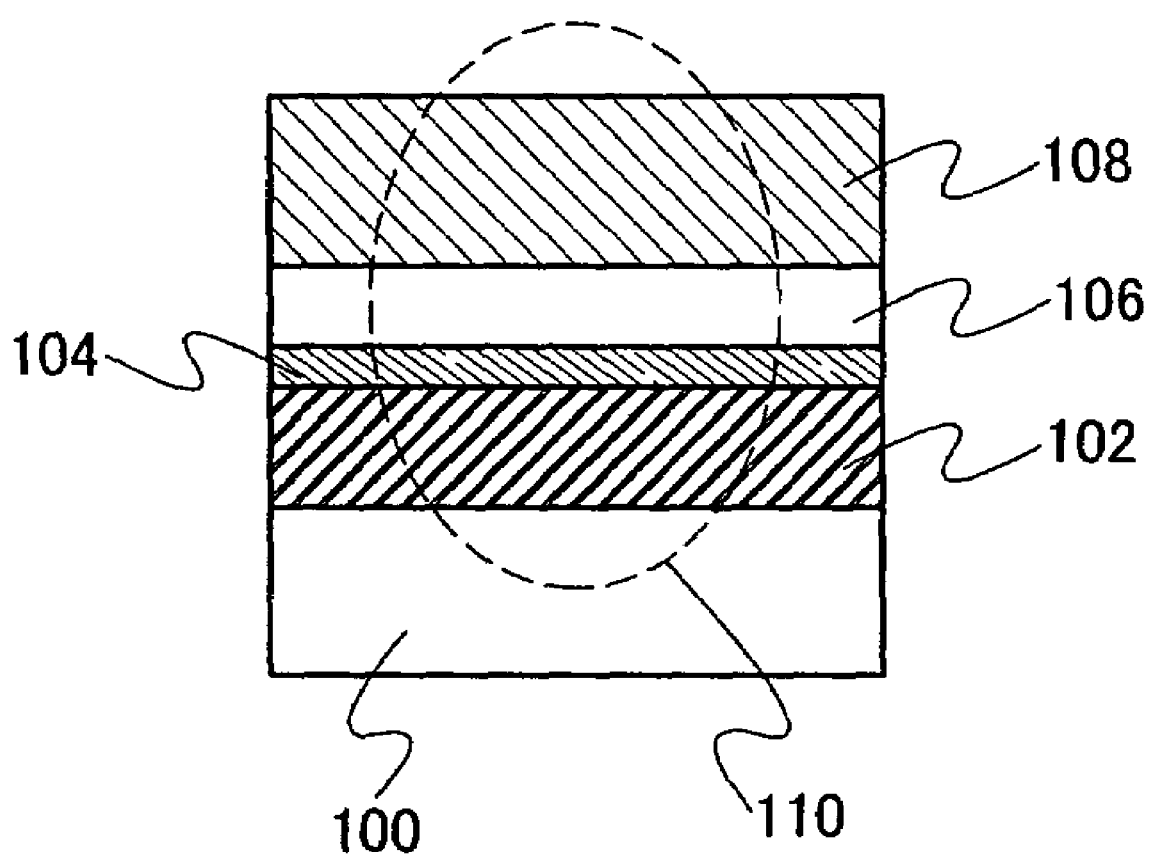
FIG. 1 shows an example of a memory element of the present invention.

A memory element 110 shown in FIG. 1 has a structure in which a first conductive layer 102, a liquid crystal layer 104, an organic compound layer 106 and a second conductive layer 108 are sequentially stacked over a substrate 100. The structure is such that the liquid crystal layer 104 and the organic compound layer 106 are interposed between the first conductive layer and the second conductive layer. In other words, the liquid crystal layer 104 is provided between and in contact with the first conductive layer 102 and the organic compound layer 106. The organic compound layer 106 is provided between and in contact with the liquid crystal layer 104 and the second conductive layer 108.

The substrate 100 can be a glass substrate, a flexible substrate, a quartz substrate, a semiconductor substrate, a metal substrate, a stainless steel substrate, a paper containing a fibrous material, or the like. The flexible substrate can be bent, and for example, a plastic substrate containing polycarbonate, polyacrylate, polyethersulfone, or the like can be given. Alternatively, a film having a thermoplastic property (which contains polyolefin, polyolefin containing fluorine, polyesters, or the like) can be used.

The memory element 110 can also be provided above a field effect transistor (FET) formed on a semiconductor substrate of Si or the like or above a thin film transistor (hereinafter also referred to as a TFT) formed over a substrate of glass or the like.

The first conductive layer 102 or the second conductive layer 108 can be formed of a metal, an alloy thereof, a metal compound, a conductive oxide material, or the like. Specifically, one kind of element or an alloy containing a plurality of elements selected from the following can be used: gold (Au), silver (Ag), platinum (Pt), nickel (Ni), tungsten (W), chromium (Cr), molybdenum (Mo), iron (Fe), cobalt (Co), copper (Cu), palladium (Pd), carbon (C), aluminum (Al), manganese (Mn), titanium (Ti), tantalum (Ta), and the like. Alternatively, a nitride of the metal, e.g., titanium nitride (TiN), tungsten nitride (WN), molybdenum nitride (MoN), or the like can be used. Further alternatively, an alkali metal such as lithium (Li) or cesium (Cs), an alkaline earth metal such as magnesium (Mg), calcium (Ca) or strontium (Sr), an alloy containing either the alkali metal or the alkaline earth metal (such as MgAg or AlLi), a rare earth metal such as europium (Er) or ytterbium (Yb), an alloy containing the rare earth metal, or the like can be used.

For the first conductive layer 102 or the second conductive layer 108, a light-transmitting conductive oxide material such as indium tin oxide (ITO), zinc oxide (ZnO), indium zinc oxide (IZO), zinc oxide to which gallium is added (GZO) or indium tin oxide including silicon oxide (ITSO) can be used. Alternatively, the first conductive layer 102 or the second conductive layer 108 can also be formed using a target of indium oxide including silicon oxide in which 2 to 20 wt % of zinc oxide (ZnO) is further mixed by a sputtering method.

The first conductive layer 102 or the second conductive layer 108 can be formed of a single layer structure or a layered structure using the above material by an evaporation method, a sputtering method, a printing method, or a droplet discharging method.

The liquid crystal layer 104 can be formed of a compound which can exhibit liquid crystallinity which transfers at least from a first phase to a second phase by temperature change. Note that the compound which can exhibit liquid crystallinity means a compound which can be in a liquid crystal state by phase transition. Therefore, the compound which can exhibit liquid crystallinity includes a compound in a solid state or a liquid state and which can become liquid crystal by phase transition. That is, the liquid crystal layer 104 can be formed of a compound which can exhibit liquid crystallinity by phase transition. Alternatively, the liquid crystal layer 104 can be formed of a compound which transfers at least from the first phase to the second phase by temperature change and forms a mixture with a conductive layer (in this embodiment mode, the first conductive layer 102) with which the liquid crystal layer has contact. Specifically, a high molecular liquid crystal as shown in the following structural formulae (1) to (4), a low molecular liquid crystal as shown in the following structural formulae (5) to (8), a fluorine-containing liquid crystal as shown in the following structural formulae (9) to (12), a metal complex liquid crystal as shown in the following structural formulae (14) and (16) and the following general formulae (13) and (15), or an organometallic high molecular liquid crystal as shown in the following general formulae (17) and (18) can be used.

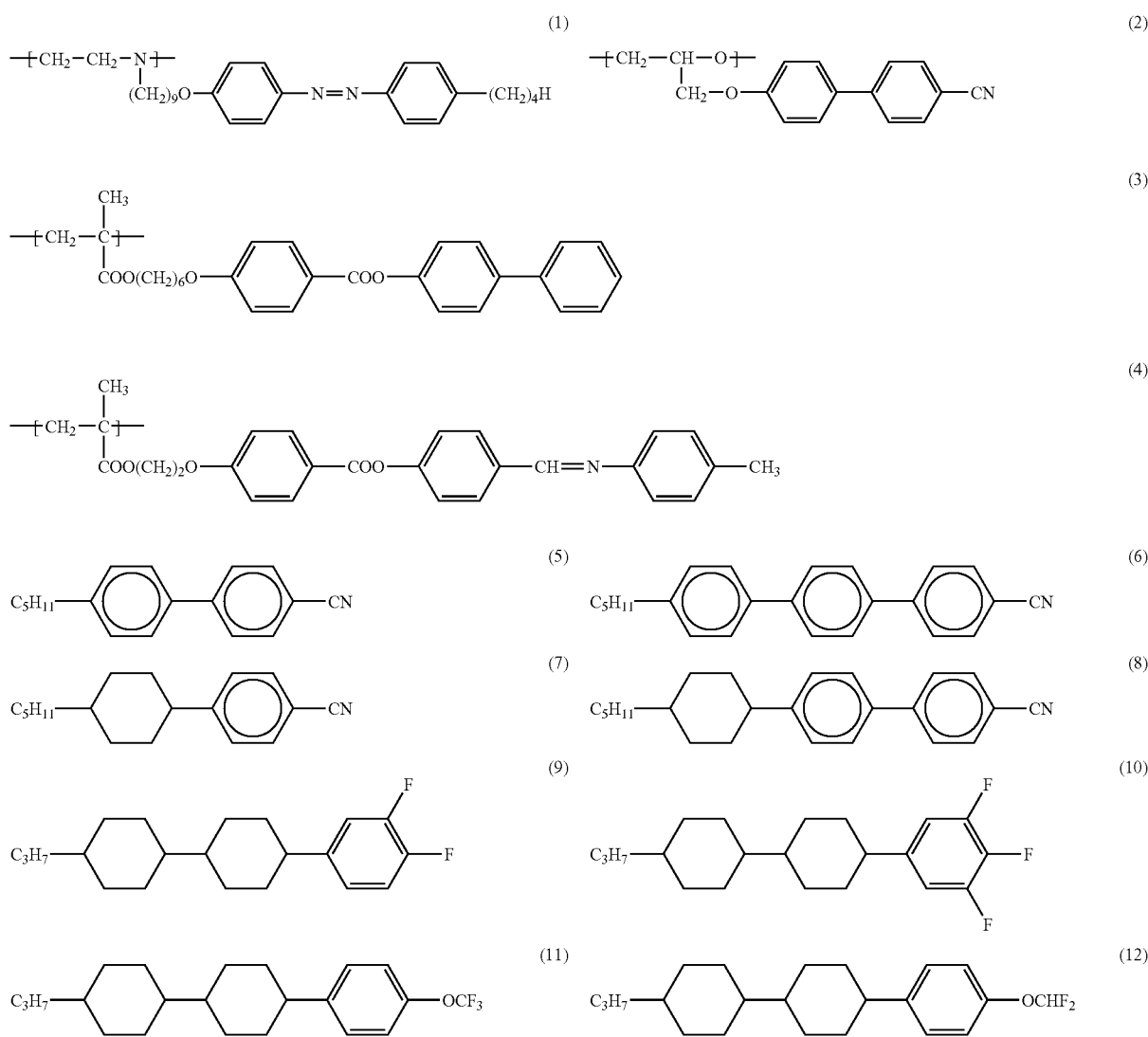

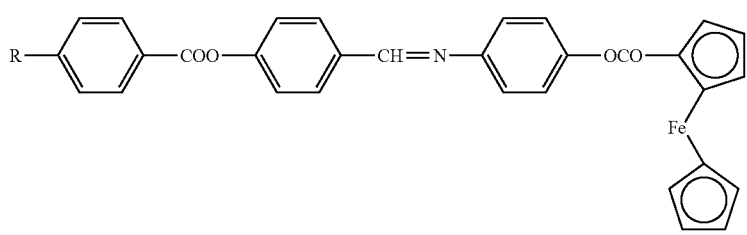
(13)

(Note in the formula that R represents an alkyl group, an alkoxyl group, an aryl group or a cyano group.)

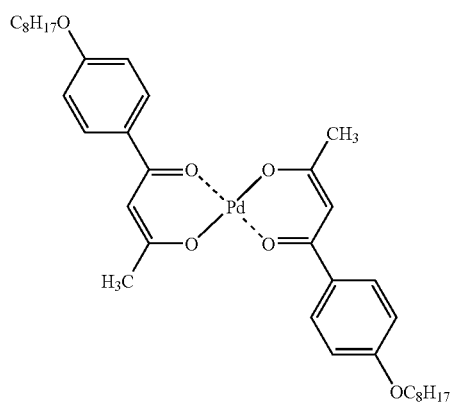
(14)

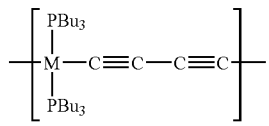
(15)

(Note in the formula that R represents an alkyl group, an alkoxyl group, an aryl group or a cyano group. M represents nickel (Ni) or platinum (Pt).)

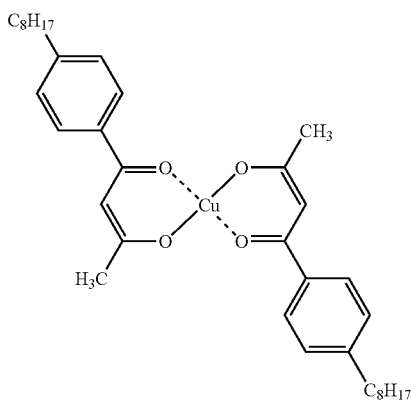
(16)

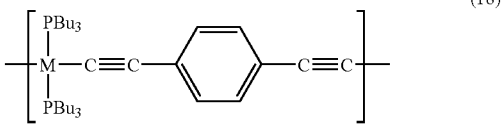
(17)

(Note in the formula that M represents nickel (Ni), palladium (Pd) or platinum (Pt).)

(18)

(Note in the formula that M represents nickel (Ni), palladium (Pd) or platinum (Pt).)

Further, the liquid crystal layer 104 can be formed by a droplet discharging method, an inkjet method, an evaporation method or a spin coating method. For example, the liquid crystal layer 104 can be formed over the first conductive layer 102 with a dispenser apparatus or an inkjet apparatus by dropping of a compound which can exhibit liquid crystallinity or a compound which can exhibit liquid crystallinity in a melting state or a solution state. Dropping of the compound which can exhibit liquid crystallinity or the compound which can exhibit liquid crystallinity in a melting state or a solution state can be conducted in an atmospheric pressure or a reduced pressure. In the case of dropping the compound which can exhibit liquid crystallinity or the compound which can exhibit liquid crystallinity in a melting state or a solution state, a substance which can exhibit liquid crystallinity which has been subjected to deforming treatment by reduction of an atmospheric pressure in advance may be used. Further, while the dropping of the compound which can exhibit liquid crystallinity or the compound which can exhibit liquid crystallinity in a melting state or a solution state is conducted, the substrate 100 may be heated. Note in this specification that the reduced pressure means a pressure which is lower than the atmospheric pressure.

The organic compound layer 106 can be formed with a single layer structure or a layered structure using an organic compound whose crystal state, resistance value, or shape as a layer varies by electric action. Specifically, an organic resin such as polyimides, polyacrylic ester or polymethacrylic acid ester, an organic compound having a hole transporting property or an organic compound having an electron transporting property can be used.

As the organic compound having a hole transporting property, an aromatic amine (i.e., including a benzene ring-nitrogen bond) compound such as 4,4'-bis[N-(1-naphthyl)-N-phenylamino]biphenyl (abbreviation: α-NPD), 4,4'-bis[N-(3-methylphenyl)-N-phenylamino]biphenyl (abbreviation: TPD), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), or N,N'-bis[4-[bis(3-methylphenyl)amino]phenyl]-N,N'-diphenyl-[1,1'-Biphenyl]-4,4'-diamine (abbreviation: DNTPD) can be used. Alternatively, a phthalocyanine compound such as phthalocyanine (abbreviation: $H_2Pc$), copper phthalocyanine (abbreviation: CuPc) or vanadyl phthalocyanine (abbreviation: VOPc) can also be used. The compounds mentioned above mainly have hole mobility of $10^{-6}$ cm$^2$/Vs or more.

As the organic compound having an electron transporting property, it is possible to use a material containing a metal complex having a quinoline skeleton or a benzoquinoline skeleton such as tris(8-quinolinolato)aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), or bis(2-methyl-8-quinolinolato)-4-phenylphenolato-aluminum (abbreviation: BAlq), or the like. Alternatively, a metal such as a metal complex having an oxazole ligand or a thiazole ligand such as bis[2-(2-hydroxyphenyl)benzoxazolato]zinc (abbreviation: $Zn(BOX)_2$) or bis[2-(2-hydroxyphenyl)benzothiazolato]zinc (abbreviation: $Zn(BTZ)_2$) can also be used. Other than the above mentioned metal complexes, 2-(4-biphenylyl)-5-(4-tert-butylphenyl)-1,3,4-oxadiazole (abbreviation: PBD); 1,3-bis[5-p-tert-butylphenyl)-1,3,4-oxadiazol-2-yl]benzene (abbreviation: OXD-7); 3-(4-tert-butylphenyl)-4-phenyl-5-(4-biphenylyl)-1,2,4-triazole (abbreviation: TAZ); 3-(4-tert-butylphenyl)-4-(4-ethylphenyl)-5-(4-biphenylyl)-1,2,4-triazole (abbreviation: p-EtTAZ); bathophenanthroline (abbreviation: BPhen); bathocuproin (abbreviation: BCP); or the like can also be used as the substance having an electron transporting property. The compounds mentioned here mainly have electron mobility of $10^{-6}$ cm$^2$/Vs or more. The organic compound layer 106 can be formed by an evaporation method, an electron beam evaporation method, a sputtering method, an inkjet method, or a spin coating method. In the case of forming the organic compound layer 106 by using a plurality of materials, the organic compound layer 106 can be formed by deposition of each of the materials at the same time. For example, the organic compound layer 106 can be formed by combining the same type of methods or different types of methods, such as co-evaporation by resistance-heating evaporations, co-evaporation by electron beam evaporations, co-evaporation by resistance-heating evaporation and electron beam evaporation, deposition by resistance-heating evaporation and sputtering, or deposition by electron beam evaporation and sputtering.

In a memory element of the present invention, by application of voltage between a pair of conductive layers of the first conductive layer and the second conductive layer, the crystal state, the resistance value or the shape as a layer of the organic compound varies so that the phase transition of the liquid crystal layer occurs. Specifically, the crystal state, the resistance value or the shape of the organic compound layer varies by application of voltage having a value higher than a predetermined value. Further, phase transition from the first phase to the second phase of the liquid crystal layer occurs by the temperature change which is caused by application of voltage having a predetermined value or higher for a predetermined period or longer, so that a mixture with the conductive layer with which the liquid crystal layer is in contact (in this embodiment mode, the first conductive layer) is formed. A region in which the liquid crystal layer and the first conductive layer form the mixture functions as a conductive layer. In other words, a portion which has functioned as the liquid crystal layer before application of voltage comes to function as the conductive layer by the application of voltage. Then, a short circuit (also referred to as short) occurs between the second conductive layer and the first conductive layer including the region where the mixture is formed by the liquid crystal layer and the conductive layer which is in contact with the liquid crystal layer, or the resistance value of the organic compound layer between the second conductive layer and the first conductive layer including the region where the mixture is formed by the liquid crystal layer and the conductive layer which is in contact with the liquid crystal layer changes. Thus, the electric resistance of the memory element is changed. In this manner, the electric resistance of the memory element of the present invention changes before and after application of voltage. Therefore, by setting the memory element before application of voltage to be in an "initial state" and setting the memory element after application of voltage to be in "a writing state", two values can be stored in the memory element. Note that the solid state (also referred to as a crystal state) of the liquid crystal layer is called the first phase, and a liquid crystal state or a liquid state (also referred to as an isotropic liquid state) of the liquid crystal layer is called the second phase.

Next, the assumed operation of the memory element of the present invention will be described in detail with reference to FIGS. 2A to 2C2.

A memory element 110 shown in FIG. 2A corresponds to the above-described memory element 110 of FIG. 1. That is, the memory element 110 has a structure where a first conductive layer 102, a liquid crystal layer 104, an organic compound layer 106 and a second conductive layer 108 are sequentially stacked over a substrate 100. Further, the memory element 110 shown in FIG. 2A is in a state before application of voltage, and the liquid crystal layer 104 is in a solid state. Note that the solid state of the liquid crystal layer 104 is called a first phase.

Memory elements shown in FIGS. 2B1 and 2B2 are each in a state where phase transition from the first phase to the second phase of the liquid crystal layer occurs by application of voltage between the first conductive layer and the second conductive layer. Specifically, they are in a state where the phase of the liquid crystal layer transfers from the solid state to the liquid crystal state or transfers from the solid state to the liquid state. The case where only the liquid crystal layer is changed by application of voltage is shown in FIG. 2B1. On the other hand, the case where phase transition of the liquid crystal layer occurs by application of voltage and the organic compound layer is transformed is shown in FIG. 2B2. The memory element of the present invention may go through either state of FIGS. 2B1 and 2B2.

In the memory element shown in FIG. 2B1, a liquid crystal layer 114 is in a liquid crystal state or a liquid state. Note that the liquid crystal state or the liquid state of the liquid crystal layer 114 is called a second phase. At this time, the shape of the organic compound layer 106 is not changed. The crystal state or the resistance value of the organic compound layer 106 may be changed. Since the memory element shown in FIG. 2B1 is provided with the liquid crystal layer 114, electric resistance of the memory element itself is not greatly influenced.

In the memory element shown in FIG. 2B2, the liquid crystal layer 114 is in a liquid crystal state or a liquid state. Note that the liquid crystal state or the liquid state of the liquid crystal layer 114 is called a second phase. The shape of the organic compound layer 106 is changed by application of voltage. Further, the second conductive layer 108 is transformed in accordance with the change in the shape of the organic compound layer 106, and the second conductive layer 108 is partially in contact with the liquid crystal layer 114. At this time, since the liquid crystal layer 114 exists between the second conductive layer 108 and the first conductive layer 102, the electric resistance of the memory element is not greatly influenced. In FIG. 2B2, the crystal state or the resistance value of the organic compound layer 106 may be changed in addition to the change in shape of the organic compound layer 106.

A memory element shown in FIG. 2C1 is in a state where the liquid crystal layer and the first conductive layer with which the liquid crystal layer is in contact form a mixture by application of voltage having a predetermined value or higher between the first conductive layer 102 and the second conductive layer 108 for a predetermined period or longer. A region where the mixture is formed in a portion where the liquid crystal layer is in contact with the first conductive layer is referred to as a mixture region 124. The mixture region 124 functions as a first conductive layer 122. The crystal state or the resistance value of the organic compound layer 106 is changed by application of voltage. Accordingly, the structure is such that only the organic compound layer 106 is interposed between the first conductive layer 122 and the second conductive layer 108, and the electric resistance of the memory element changes in accordance with the change in the crystal state or the resistance value of the organic compound layer 106.

A memory element shown in FIG. 2C2 is in a state where the liquid crystal layer and the first conductive layer which is in contact with the liquid crystal layer form a mixture by application of voltage having a predetermined value or higher between the first conductive layer 102 and the second conductive layer 108 for a predetermined period or longer. A region where the mixture is formed in a portion where the liquid crystal layer is in contact with the first conductive layer is referred to as the mixture region 124. The mixture region 124 functions as the first conductive layer 122. The shape of the organic compound layer 106 is changed by application of voltage. Accordingly, a short circuit between the first conductive layer 122 including the mixture region 124 and the transformed second conductive layer 108 occurs; thereby changing the electric resistance of the memory element.

The electric resistance of the memory element of the present invention changes as described above, so that data writing is possible by utilizing the change in the electric resistance. The memory element of the present invention has such a structure that only the organic compound layer is interposed between the first conductive layer and the second conductive layer, since the liquid crystal layer and the first conductive layer form the mixture. The resistance value of the memory element of the present invention changes by the change in the crystal state or the resistance value of the interposed organic compound layer or by the short circuit between the first conductive layer and the second conductive layer. Accordingly, change in the electric resistance of the memory element of the present invention is controlled by the phase transition of the liquid crystal layer.

Note that since the memory element of the present invention is controlled by the liquid crystal layer, the process of the change of the organic compound layer 106 by application of voltage is not limited to those shown in FIGS. 2A to 2C2.

The memory element of the present invention can be thickened by provision of the liquid crystal layer and the organic compound layer between the first conductive layer and the second conductive layer; accordingly, an initial defect such as a short circuit in an initial state can be prevented.

EMBODIMENT MODE 2

A memory element and a semiconductor device including the memory element, typically a memory device, of the present invention will be exemplarily described with reference to FIGS. 3A to 5C. Specifically, a passive matrix memory device will be exemplarily described.

Figure 3A:
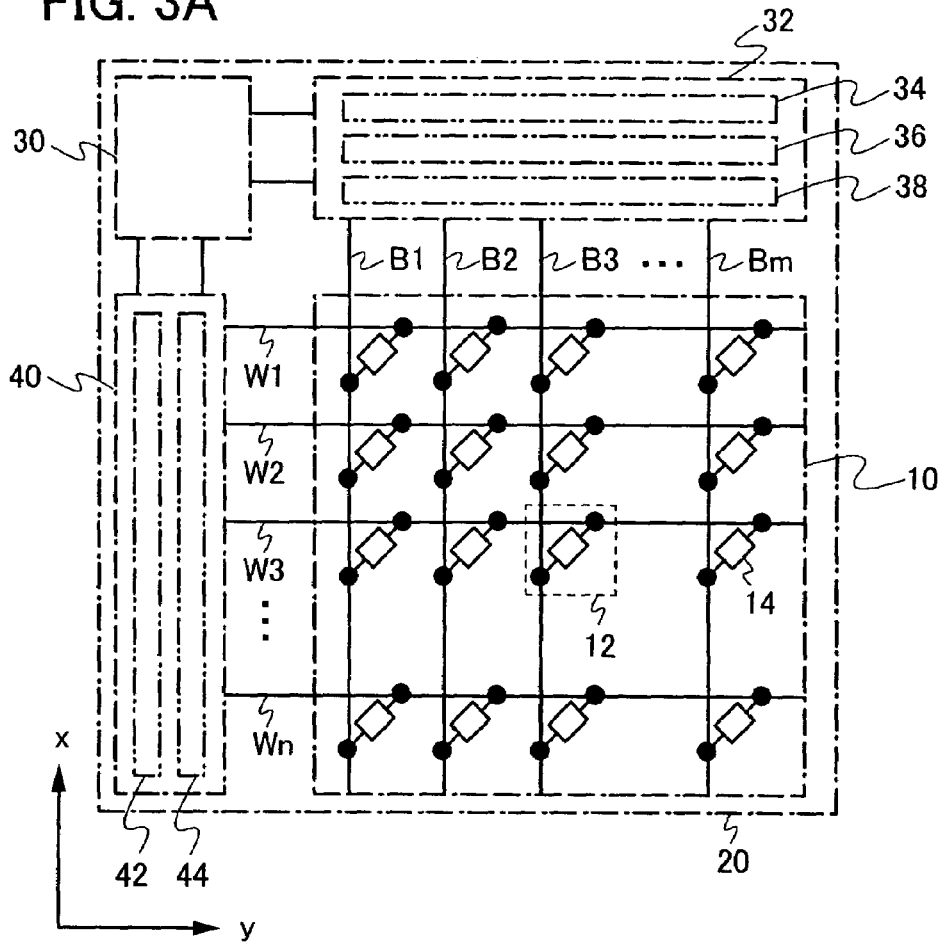
FIGS. 3A to 3C show examples of a semiconductor device of the present invention.

FIG. 3A shows an example of the memory device of the present invention, in which a memory cell array 10, a bit line driver circuit 32, a word line driver circuit 40 and an interface 30 are provided over a substrate 20.

The memory cell array 10 is structured by a plurality of bit lines Bx ($1 \leq x \leq m$) extending in the x direction and a plurality of word lines Wy ($1 \leq y \leq n$) extending in the y direction which is perpendicular to the x direction. At intersecting portions of the bit lines Bx and the word lines Wy, memory cells 12 each including a memory element 14 are provided. The memory cells 12 are provided in matrix in the memory cell array 10.

The bit line driver circuit 32 includes a column decoder 34, a reading/writing circuit 36 and a selector 38. In addition, the bit line driver circuit 32 is connected to the bit lines Bx and the interface 30.

The word line driver circuit 40 includes a row decoder 42 and a level shifter 44. In addition, the word line driver circuit 40 is connected to the word lines Wy and the interface 30.

The interface 30 is a circuit which supplies signals input from the outside to the bit line driver circuit 32 or the word line driver circuit 40 or which supplies signals output from the bit line driver circuit 32 to the outside.

The structure shown in FIG. 3A is just an example, and another circuit such as a sense amplifier, an output circuit or a buffer circuit may be included. Further, a writing circuit may be provided for the interface 30.

Figure 4A:
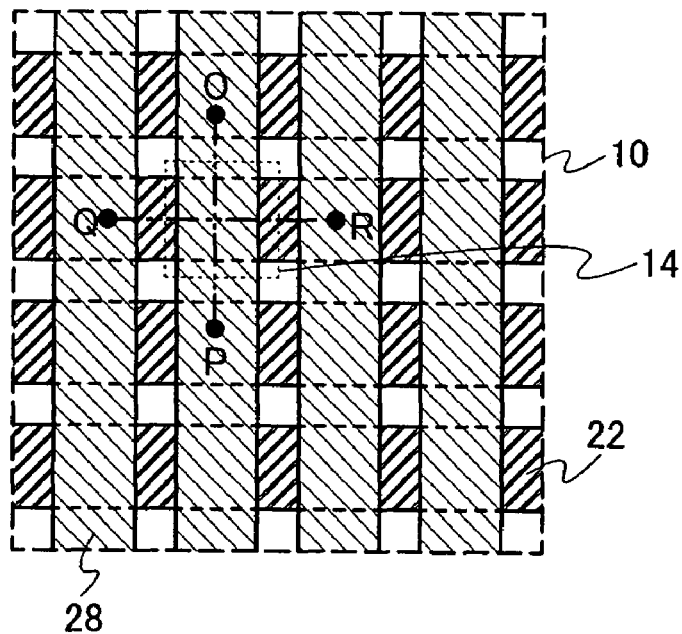
FIGS. 4A and 4B are a top view and a cross-sectional view, respectively, of an example of a semiconductor device of the present invention.
Figure 4B:
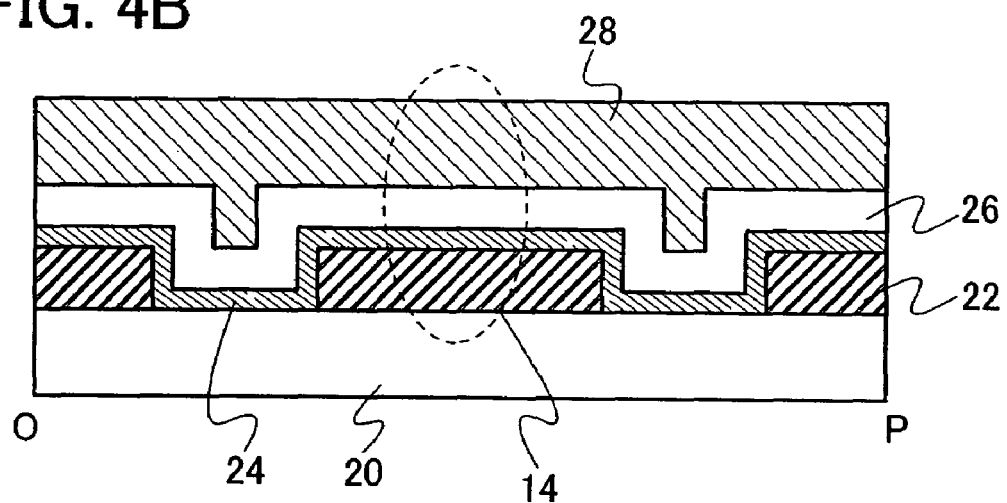

Next, the memory cells 12 will be described in detail with reference to FIGS. 4A and 4B. FIG. 4A shows an example of a top view of the memory cell array 10. FIG. 4B shows an example of a cross sectional view taken along a broken line O-P of FIG. 4A. In FIG. 4A, structures other than a first conductive layer and a second conductive layer are partially omitted.

Figure 5A:
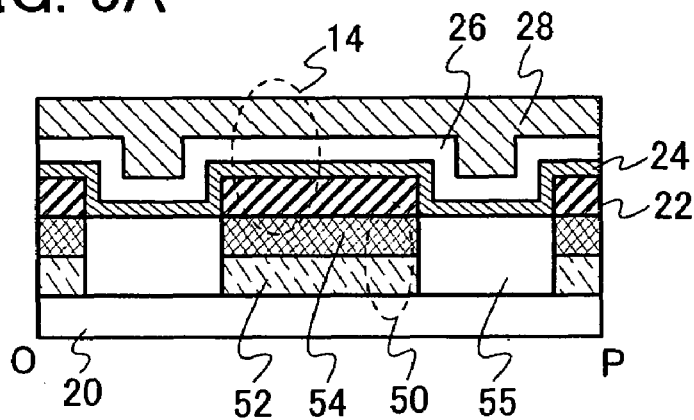
FIGS. 5A to 5C show cross-sectional views of examples of a semiconductor device of the present invention.
Figure 5B:
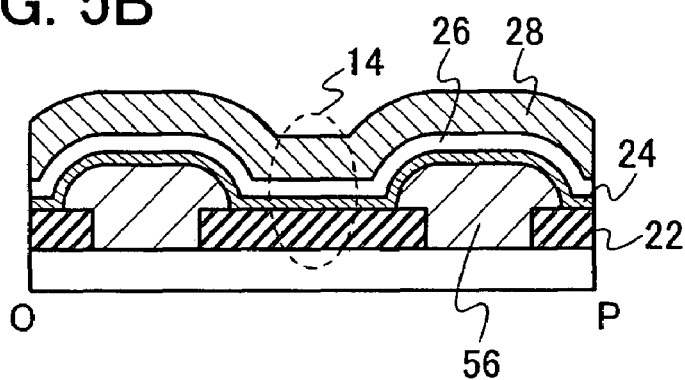
Figure 5C:
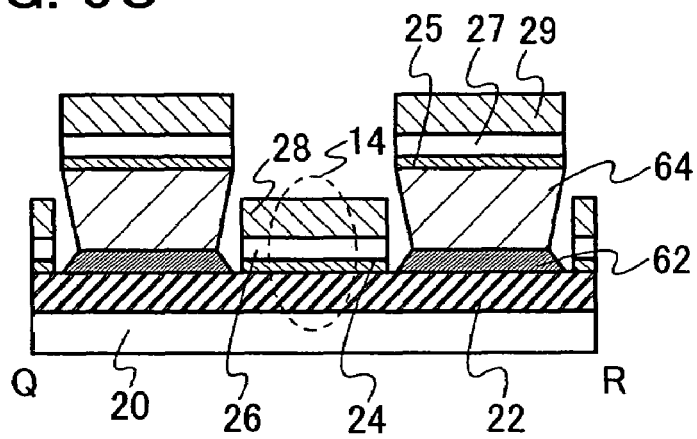

Each of the memory cells 12 is provided in a portion where a first conductive layer 22 forming the bit line Bx intersects with a second conductive layer 28 forming the word line Wy. Each of the memory cells 12 includes the memory element 14 as described in Embodiment Mode 1. The memory element 14 preferably has a structure where at least the first conductive layer, a liquid crystal layer in contact with the first conductive layer, an organic compound layer in contact with the liquid crystal layer and the second conductive layer in contact with the organic compound layer are sequentially stacked. Accordingly, the memory element 14 can have any of the structures as shown in FIGS. 5A to 5C. The memory elements shown in FIGS. 5A to 5C correspond to the cross sections taken along the broken line O-P or a broken line Q-R of FIG. 4A.

For example as shown in FIG. 5A, an element having a rectifying property may be provided on the side opposite to an organic compound layer 26 with the first conductive layer 22 interposed therebetween. As the element having a rectifying property, a schottky diode, a diode having a PN junction, a diode having a PIN junction, or a transistor in which a gate electrode is connected to a drain electrode is given. Here, a diode 50 including a third conductive layer 52 and a semiconductor layer 54 is provided in contact with the first conductive layer 22. At this time, the semiconductor layer 54 is interposed between the first conductive layer 22 and the third conductive layer 52. Alternatively, the element having a rectifying property may be provided on the side opposite to the organic compound layer 26 with the second conductive layer 28 interposed therebetween. At this time also, the semiconductor layer 54 is interposed between the second conductive layer 28 and the third conductive layer. Further alternatively, the element having a rectifying property may be provided between the organic compound layer 26 and the second conductive layer 28. As a typical example of the diode, a PN junction diode, a diode having a PIN junction, an avalanche diode, or the like is given. Alternatively, a diode having another structure may be used. By providing the element having a rectifying property in this way, current flows only in one direction, whereby decreasing errors and improving reading certainty. In addition, an insulating layer 55 which insulates diodes is provided between adjacent memory elements.

A thin film transistor (TFT) may be provided over an insulating substrate and the memory element 14 may be provided thereover. Alternatively, a field effect transistor (FET) may be formed over a semiconductor substrate of Si or the like or an SOI substrate instead of using the insulating substrate, and the memory element 14 may be provided thereover. Although an example in which the memory element 14 is formed over the thin film transistor or the field effect transistor is shown here, the memory element may be provided in such a way that the memory element is attached to the thin film transistor or the field effect transistor. In this case, the memory element and the thin film transistor or the field effect transistor are manufactured in separate steps, and later the memory element and the thin film transistor or the field effect transistor are attached to each other with a conductive film, an anisotropic conductive adhesive, or the like. Moreover, any known structure is applicable as the structure of the thin film transistor or the field effect transistor.

If an influence of an electric field in a lateral direction between the adjacent memory elements is concerned, an insulating layer functioning as a partition wall (hereinafter also referred to as a partition wall layer) may be provided between the organic compound layers provided in each memory element in order to separate the organic compound layers. The organic compound layer may be selectively provided for each memory cell.

For example as shown in FIG. 5B, a partition wall layer 56 may be provided between the adjacent first conductive layers 22 when providing a liquid crystal layer 24 and the organic compound layer 26 to cover the first conductive layers 22. By employing such a structure, disconnection of the liquid crystal layer 24 and the organic compound layer 26 caused by a step of the first conductive layer 22 or an influence of an electric field in a lateral direction between the memory cells can be prevented. In a cross section of the partition wall layer 56, a side surface of the partition wall layer 56 preferably has a tilt angle of 10° or more and less than 60°, and preferably 25° or more and 45° or less with respect to a surface of the first conductive layer 22. Moreover, it is preferable that the partition wall layer 56 be curved. Then, the liquid crystal layer 24, the organic compound layer 26 and the second conductive layer 28 are formed so as to cover the first conductive layer 22 and the partition wall layer 56.

Alternatively, the partition wall layer 56 may be formed after forming the liquid crystal layer 24 over the first conductive layer 22. In this case, it is preferable that the partition wall layer 56 be formed of a material which has an etching selectivity with a material for forming the liquid crystal layer 24.

Further, as shown in FIG. 5C, an interlayer insulating layer 62 covering a part of the first conductive layer 22 which is provided over the substrate 20 and extends in the x direction, and a partition wall layer 64 over the interlayer insulating layer 62 may be provided. The interlayer insulating layer 62 has at least an opening portion per memory element 14. Moreover, the partition wall layer 64 is provided in a region where the opening portion is not formed, of the interlayer insulating layer 62 so as to extend in the y direction. In a cross section of the partition wall layer 64, a sidewall of the partition wall layer 64 has a tilt angle of 95° or more and 135° or less with respect to a surface of the interlayer insulating layer 62.

Although a material of the partition wall layer 64 is not particularly limited, the partition wall layer 64 can be formed by photolithography with the use of, for example, a positive photosensitive resin, of which an unexposed portion remains when light exposure is conducted. In this case, the amount of light exposure and developing time are adjusted so that a part lower than the pattern to be a partition wall layer is etched more; accordingly, the partition wall layer having a preferable tilt angle can be formed. The partition wall layer 64 may be formed by photolithography or etching with the use of an inorganic insulating material, an organic insulating material, or the like.

Moreover, the thickness of the interlayer insulating layer 62 and the partition wall layer 64 is set larger than the thickness of the liquid crystal layer 24, the organic compound layer 26 and the second conductive layer 28. As a result, only by the step of providing the organic compound layer 26 and the second conductive layer 28 by evaporation for the whole surface of the substrate 20, the stripe-shaped organic compound layer 26 and second conductive layer 28 which are divided into a plurality of regions that are electrically independent and which extend in the y direction intersecting with the x direction can be formed. Therefore, the number of steps can be decreased. Although a liquid crystal layer 25, an organic compound layer 27 and a second conductive layer 29 are formed over the partition wall layer 64, these are separated from the liquid crystal layer 24, the organic compound layer 26 and the second conductive layer 28 which form the memory element 14.

Next, data writing operation of a memory device of the present invention will be exemplarily described. In the case of writing data in the memory cell 12 which is located in the x-th column and the y-th row among the plurality of memory cells 12 provided in the memory cell array 10 shown in FIG. 3A, for example, a bit line Bx in the x-th column and a word line Wy in the y-th row are first selected by the row decoder 42, the column decoder 34 and the selector 38, and then the memory cell 12 located at an intersecting portion of the bit line Bx and the word line Wy is selected. Then, data is written in the selected memory cell 12 by the writing circuit.

The memory cell 12 includes the memory element 14. As described in Embodiment Mode 1, the electric resistance of the memory element 14 changes before and after application of voltage. Accordingly, by utilizing the change in the electric resistance of the memory element, data writing in the memory cell 12 can be selectively conducted.

Figure 3B:
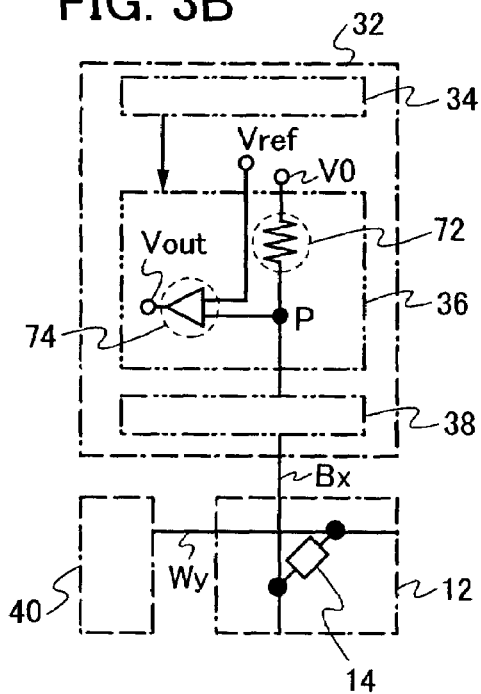
Figure 3C:
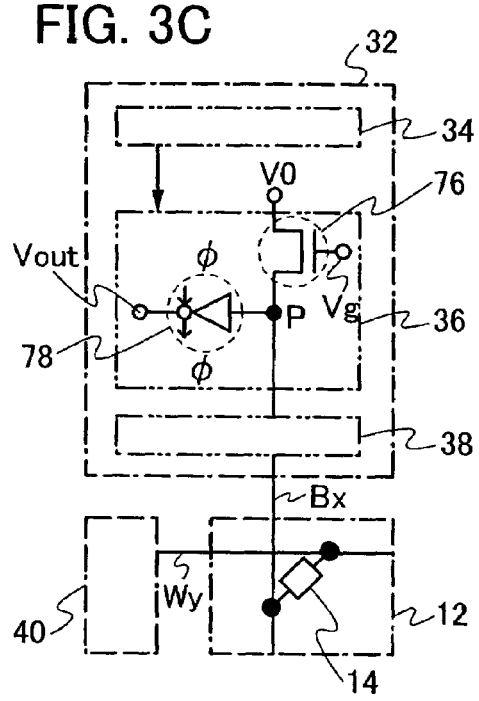

Specific operation in writing data to a memory device of the present invention will be described with reference to FIGS. 3A to 3C. Data writing is conducted by changing the electrical characteristic such as electric resistance of the memory cell. It is assumed that an initial state (a state where an electric action is not applied) of the memory cell is data "0" and a state where the electrical characteristic is changed is data "1".

In the case of writing the data "1" in the memory cell 12, the memory cell 12 is selected first by the row decoder 42, the level shifter 44, the column decoder 34 and the selector 38 which are shown in FIG. 3A. For example, in the case of selecting the memory cell 12 located at an intersecting portion of a bit line B3 and a word line W3, a predetermined voltage V2 is applied to the word line W3 which is connected to the memory cell 12, by the row decoder 42 and the level shifter 44. In addition, the bit line B3 connected to the memory cell 12 is connected to the reading/writing circuit 36 by the column decoder 34 and the selector 38. Then, a writing voltage V1 is output from the reading/writing circuit 36 to the bit line B3. Thus, a voltage Vw (=V1−V2) is applied between the first conductive layer and the second conductive layer which form the memory cell 12. By selecting the voltage Vw appropriately, a mixture is formed in a portion where the first conductive layer and the liquid crystal layer included in the memory element 14 have contact with each other, and accordingly the organic compound layer provided between the liquid crystal layer and the second conductive layer is changed physically or electrically, so that the data "1" can be written. Specifically, the organic compound layer is changed so that the electrical resistance between the first conductive layer and the second conductive layer in a state of having the data "1" is much smaller than that in a state of having the data "0" at reading operation voltage. For example, V1 is set to 0 V and V2 is appropriately selected from 5 to 15 V. Alternatively, V1 is appropriately selected from 3 to 5 V, and V2 is appropriately selected from −12 to −2 V. The voltage Vw may be set in the range of 5 to 15 V or −5 to −15 V.

Non-selected word lines and non-selected bit lines are controlled so that the data "1" is not written in the memory cells connected to the non-selected word lines and the non-selected bit lines. For example, the non-selected word lines and the non-selected bit lines may be in a floating state. It is necessary to include a layer having a characteristic capable of securing selectivity such as a diode characteristic between the first conductive layer and the second conductive layer which form the memory cell have.

On the other hand, in the case of writing the data "0" in the memory cell 12, electric action is not applied to the memory cell 12. In circuit operation, the memory cell 12 is selected by the row decoder 42, the level shifter 44, the column decoder 34, and the selector 38 similarly to the case of writing the data "1"; however, an output potential from the reading/writing circuit 36 to the bit line B3 is set to be similar to a potential of the selected word line W3 or potentials of the non-selected word lines and voltage of such a degree that the electrical characteristic of the memory cell 12 does not change (for example, −5 to 5 V) may be applied between the first conductive layer and the second conductive layer which form the memory cell 12.

Then, specific operation for reading data from the organic memory is described. Data reading is conducted by using the difference between the memory cell having the data "0" and the memory cell having the data "1" in the electrical characteristic between the first conductive layer and the second conductive layer which form the memory cell. For example, effective electrical resistance between the first conductive layer and the second conductive layer which form the memory cell having the data "0" (hereinafter the effective electrical resistance is simply referred to as electrical resistance of the memory cell) is assumed to be R0 at the reading voltage, while the electrical resistance of the memory cell having the data "1" is assumed to be R1 at the reading voltage, and a method of reading the data by using the difference in the electrical resistance will be described. It is assumed that the relation, R1<<R0, is made. As a configuration of a reading portion of the reading/writing circuit 36, a circuit using a resistor element 72 and a differential amplifier 74 shown in FIG. 3B can be used. The resistor element 72 has a resistance value Rr, and it is assumed that the relation, R1<Rr<R0, is made. As shown in FIG. 3C, a transistor 76 may be provided instead of the resistor element 72 and a clocked inverter 78 may be provided instead of the differential amplifier. A signal φ or an inverted signal φ, which becomes High when reading is conducted and Low when reading is not conducted, is input to the clocked inverter 78. The circuit configuration is not limited to those in FIGS. 3B and 3C.

In the case of reading data from the memory cell 12, the memory cell 12 is first selected by the row decoder 42, the level shifter 44, the column decoder 34 and the selector 38. Specifically, a predetermined voltage Vy is applied to the word line Wy connected to the memory cell 12, by the row decoder 42 and the level shifter 44. In addition, the bit line Bx connected to the memory cell 12 is connected to a terminal P of the reading/writing circuit 36 by the column decoder 34 and the selector 38. As a result, a potential Vp of the terminal P is set to be a value that is determined by resistance division by the resistor element 72 (resistance value Rr) and the memory cell 12 (resistance value R0 or R1). Accordingly, if the memory cell 12 has the data "0", Vp0=Vy+(V0−Vy)×R0/(R0+Rr). If the memory cell 12 has the data "1", Vp1=Vy+(V0−Vy)×R1/(R1+Rr). Therefore, Vref is selected so as to have a value between the Vp0 and the Vp1 in FIG. 3B and a point of change of the clocked inverter is selected so as to be between the Vp0 and the Vp1 in FIG. 3C. Accordingly, Low/High (or High/Low) is output as an output potential Vout in accordance with the data "0" or data "1", thereby conducting data reading.

For example, the differential amplifier 74 is operated at Vdd=3 V, and the Vy is set to be 0 V, the V0 is set to be 3 V, and the Vref is set to be 1.5 V. If R0/Rr=Rr/R1=9, in the case where the memory cell has the data "0", the Vp0 is 2.7 V and High is output as the Vout, while in the case where the memory cell has the data "1", the Vp1 is 0.3 V and Low is output as the Vout. Thus, data reading from the memory cell can be conducted.

According to the above method, the state of the electrical resistance of the memory element 14 is read by the voltage value, using the difference in the resistance value and the resistance division. The reading method is not limited to this method. For example, instead of the method using the difference in the electrical resistance, a reading method using a difference in a current value is also applicable. Alternatively, in the case where the electrical characteristic of the memory cell has a diode characteristic in which threshold voltage varies between the data "0" and "1", the difference in the threshold voltage may be used for reading. Furthermore, a method in which resistance of a memory element is regarded as an amount of current to be read or a method in which a bit line is precharged can also be employed.

Note that this embodiment mode can be freely implemented in combination with the above embodiment mode.

According to the present invention, initial defects of a memory element can be reduced and yield in manufacturing a semiconductor device including the memory element can be improved.

According to the present invention, it is possible to provide a semiconductor device including a memory element in which writing at a time other than a manufacturing process (additional recording) of data is possible and forgery caused by rewriting of data can be prevented.

EMBODIMENT MODE 3

A memory element and a semiconductor device including the memory element, typically a memory device, of the present invention will be exemplarily described with reference to FIGS. 6A to 9. Specifically, an active matrix memory device will be exemplarily described.

Figure 6A:
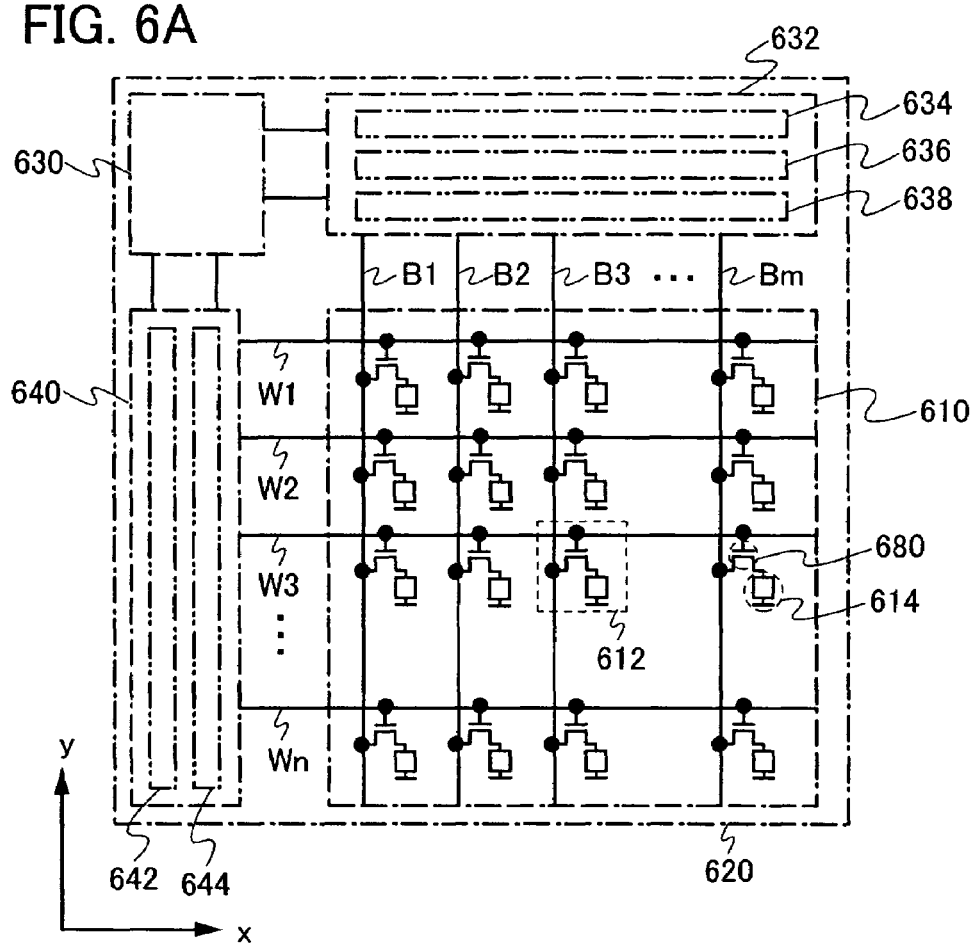
FIGS. 6A to 6C show examples of a semiconductor device of the present invention.

FIG. 6A shows an example of the memory device, in which a memory cell array 610, a bit line driver circuit 632, a word line driver circuit 640 and an interface 630 are included over a substrate 620.

The memory cell array 610 is structured by a plurality of bit lines Bx ($1 \leq x \leq m$) extending in the x direction and a plurality of word lines Wy ($1 \leq y \leq n$) extending in the y direction which is perpendicular to the x direction. At intersecting portions of the bit lines Bx and the word lines Wy, memory cells 612 each including a transistor 680 and a memory element 614 are provided. The memory cells 612 are provided in matrix in the memory cell array 610.

The bit line driver circuit 632 includes a column decoder 634, a reading/writing circuit 636 and a selector 638. In addition, the bit line driver circuit 632 is connected to the bit lines Bx and the interface 630.

The word line driver circuit 640 includes a row decoder 642 and a level shifter 644. In addition, the word line driver circuit 640 is connected to the word lines Wy and the interface 630.

The interface 630 is a circuit which supplies signals input from the outside to the bit line driver circuit 632 or the word line driver circuit 640 or which supplies signals output from the bit line driver circuit 632 to the outside.

The structure shown in FIG. 6A is just an example, and another circuit such as a sense amplifier, an output circuit or a buffer circuit may be included. Further, a writing circuit may be provided for the interface 630.

Figure 7A:
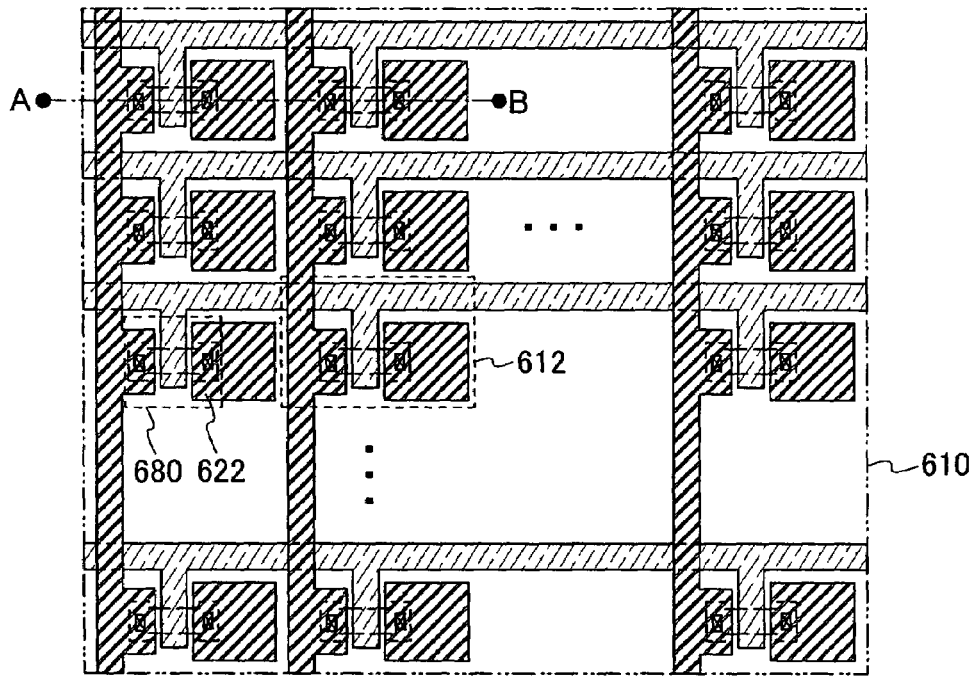
FIGS. 7A to 7C are a top view and cross-sectional views of examples of a semiconductor device of the present invention.
Figure 7B:
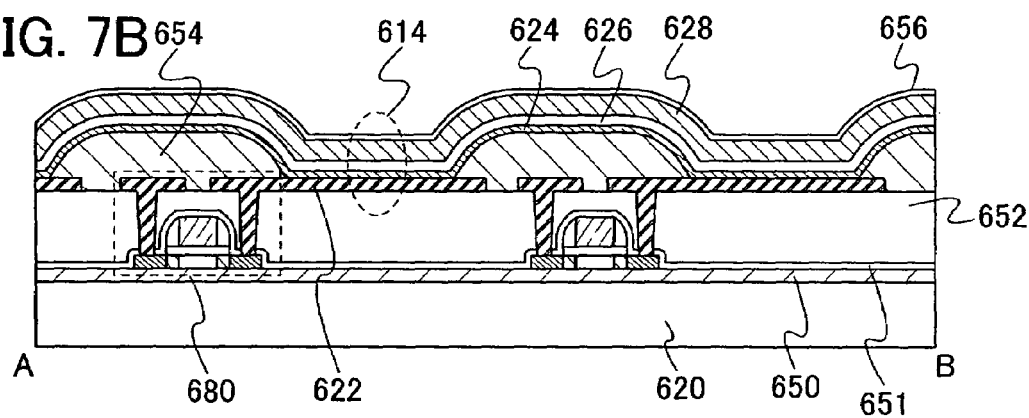

Next, the memory cells 612 will be described in detail with reference to FIGS. 7A to 7C. FIG. 7A shows an example of a top view of the memory cell array 610. FIG. 7B shows an example of a cross sectional view taken along a broken line A-B of FIG. 7A. In FIG. 7A, structures other than transistors and first conductive layers are partially omitted.

Each of the memory cells 612 has an electrode (a source electrode or a drain electrode) connected to a bit line Bx ($1 \leq x \leq m$), an electrode connected to a word line Wy ($1 \leq y \leq n$), the memory element 614 and the transistor 680. The memory element 614 has a structure as shown in Embodiment Mode 1 or 2, in which at least the first conductive layer, a liquid crystal layer in contact with the first conductive layer, an organic compound layer in contact with the liquid crystal layer, and the second conductive layer in contact with the organic compound layer are sequentially stacked. Further, a gate electrode of the transistor 680 is connected to the word line Wy, one of a source electrode and a drain electrode is connected to the bit line Bx, and the other of them is connected to the first electrode 622 of the memory element 614 or functions as the first electrode 622 of the memory element 614. The second electrode 628 of the memory element is connected to a common electrode (electric potential, Vcom).

For example, as shown in FIG. 7B, the memory element 614 can be formed over the substrate 620 over which the transistor 680 is provided. The memory element 614 has a structure in which the first conductive layer 622, the liquid crystal layer 624, the organic compound layer 626 and the second conductive layer 628 are sequentially stacked, similarly to the memory element described in Embodiment Mode 1 or 2. A partition wall layer 654 which covers end portions of the first conductive layers 622 is provided between the adjacent first conductive layers. In this embodiment mode, an insulating layer 656 functioning as a protective layer is provided over the memory element 614.

The transistor 680 is provided over the substrate 620 with a base insulating layer 650 interposed therebetween. Further, a conductive layer functioning as the source electrode or the drain electrode of the transistor 680 is connected to the first conductive layer 622 of the memory element 614.

Various transistors can be used as the transistor 680 of this embodiment mode. Here, an example of the transistor which is applicable as the transistor 680 is described with reference to FIGS. 8A to 8D.

Figure 8A:
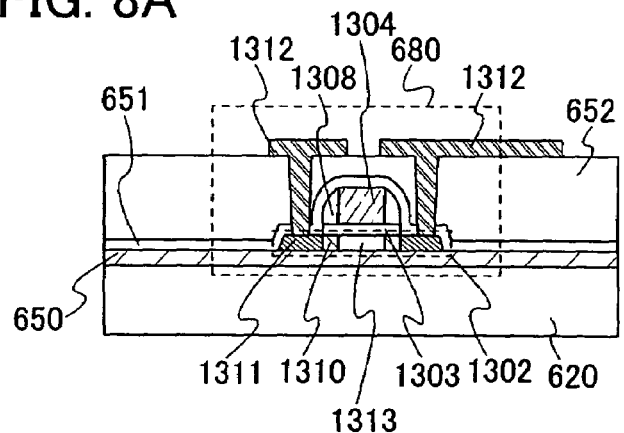
FIGS. 8A to 8D are cross-sectional views of examples of a semiconductor device of the present invention.

For example, FIG. 8A shows an example of applying a top-gate type thin film transistor (hereinafter referred to as a TFT). The transistor (TFT) 680 shown here includes a semiconductor layer 1302 provided over a base insulating layer 650, a gate insulating layer 1303 provided over the semiconductor layer 1302 and a gate electrode 1304 provided over the gate insulating layer 1303.

Over the semiconductor layer 1302 and the gate electrode 1304, an insulating layer 651 and an insulating layer 652 functioning as interlayer insulating layers are provided. Further, conductive layers 1312 which are in contact with the semiconductor layer 1302 through the insulating layer 651 and the insulating layer 652 are provided. The conductive layers 1312 function as a source electrode and a drain electrode of the transistor 680. One of the conductive layers 1312 is connected to the first conductive layer 622 of the memory element 614 or functions as the first conductive layer 622.

The semiconductor layer 1302 is formed of a semiconductor having a crystalline structure, and can be formed using an amorphous semiconductor or a single crystalline semiconductor. In particular, a crystalline semiconductor formed by crystallizing an amorphous or microcrystalline semiconductor by laser irradiation, a crystalline semiconductor formed by crystallizing an amorphous or microcrystalline semiconductor by heat treatment, or a crystalline semiconductor formed by crystallizing an amorphous or microcrystalline semiconductor by heat treatment and laser irradiation is preferable. In the heat treatment, a crystallization method using a metal element such as nickel, which has a function of promoting crystallization of a silicon semiconductor, can be employed.

In the case where crystallization is conducted by laser light irradiation, the crystallization can be performed by using continuous wave laser light or ultrashort pulsed laser light with a high repetition rate of 10 MHz or higher and a pulse width of 1 nanosecond or shorter, preferably 1 to 100 picoseconds, in such a way that a melting zone in which the crystalline semiconductor is melted is moved continuously in an irradiation direction of the laser light. By using such a crystallization method, a crystalline semiconductor having a large grain diameter with a crystal grain boundary extending in one direction can be obtained. By making a drift direction of carriers conform to the direction where the crystal grain boundary extends, electric field effect mobility in the transistor can be increased. For example, 400 $cm^2/V \cdot sec$ or more can be achieved.

In the case of conducting crystallization using a crystallization process where the temperature is equal to or lower than the allowable temperature limit of a glass substrate (approximately 600° C.), a large glass substrate can be used. Accordingly, a large number of semiconductor devices can be manufactured with one substrate, and cost can be reduced.

The semiconductor layer 1302 can be formed by conducting a crystallization process with heating at a temperature higher than the allowable temperature limit of a glass substrate. Typically, a quartz substrate is used as the insulating substrate and an amorphous or microcrystalline semiconductor is heated at 700° C. or higher to form the semiconductor layer 1302. As a result, a semiconductor with high crystallinity can be formed. Therefore, a thin film transistor which is superior in response speed, mobility, and the like and capable of high-speed operation can be provided.

The semiconductor layer 1302 includes a channel formation region 1313, a pair of high concentration impurity regions 1311 which function as a source region and a drain region, and a pair of low concentration impurity regions 1310 (also referred to as LDD regions) which are located between the channel formation region and the high concentration impurity regions. The high concentration impurity regions 1311 and the low concentration impurity regions 1310 are each doped with an impurity having one conductivity type, and the high concentration impurity regions 1311 are doped with the impurity at a concentration higher than that of the low concentration impurity regions 1310. Further, the channel formation region 1313 overlaps with the gate electrode 1304 with the gate insulating layer 1303 interposed therebetween, and the low concentration impurity regions 1310 overlaps with sidewalls 1308 with the gate insulating layer 1303 interposed therebetween. Note that the present invention is not limited to this example, and the low concentration impurity regions may be formed so as to overlap with the gate electrode, or the structure in which the low concentration impurity regions are not formed may be employed.

The gate insulating layer 1303 is formed with a single layer structure or a layered structure using an insulating film of silicon nitride, silicon oxide, or another material containing silicon by a thin film formation method such as a plasma CVD method or a sputtering method. The gate insulating layer 1303 can also be formed using a solution having an insulating property by a droplet discharging method, a coating method, a sol-gel method, or the like. As typical examples of the solution having an insulating property, a solution in which an inorganic oxide fine particle is dispersed; or a solution containing any of polyimide, polyamide, polyester, acrylic, PSG (phosphosilicate glass), BPSG (borophosphosilicate glass), a silicate material, an alkoxy silicate material, a polysilazane material or $SiO_2$ having a Si—$CH_2$ bond typified by polymethyl siloxane can be appropriately used.

The gate electrode 1304 can be formed of a metal or a polycrystalline semiconductor added with an impurity having one conductivity type. When the gate electrode 1304 is formed of a metal, tungsten (W), molybdenum (Mo), titanium (Ti), tantalum (Ta), aluminum (Al), or the like can be used. Further, metal nitride formed by nitridation of the above mentioned metal can be used. Further, the gate electrode 1304 may include a first layer containing such metal nitride and a second layer containing such metal. In the case where the gate electrode 1304 has a layered structure, an end portion of the first layer may extend further toward the outside than an end portion of the second layer. In this case, when the first layer is formed using the metal nitride, the first layer can serve as a barrier metal. That is, such the first layer can prevent the metal contained in the second layer from dispersing in the gate insulating layer 1303 or the underlying semiconductor layer 1302.

The sidewalls (sidewall spacers) 1308 are provided at both sides of the gate electrode 1304. The sidewalls 1308 can be formed in the following manner: an insulating layer including silicon oxide is formed by a CVD method after forming the gate electrode 1304, and the insulating layer is subjected to an anisotropic etching by an RIE (reactive ion etching) method. The side walls 1308 need not necessarily be provided.

The insulating layers 651 and 652 are formed of an inorganic insulating material such as silicon oxide or silicon oxynitride, or an organic insulating material such as an acrylic resin or a polyimide resin. When a coating method such as spin coating or roll coating is used, an insulating layer including silicon oxide, which is formed by applying a liquid insulating material and subjecting the liquid material to heat treatment can also be used. For example, an insulating layer containing silicon oxide formed by applying a material containing a siloxane bond and subjecting the material to heat treatment at 200 to 400° C. can be used. When insulating layers formed by a coating method or insulating layers which are planarized by reflow are formed as the insulating layers 651 and 652, disconnection of a wiring provided over the insulating layers can be prevented. Further, such a method can be effectively used in a case of forming a multilayer wiring. Although the interlayer insulating layer has a two-layered structure here, there is no particular limitation and a single layer structure or a layered structure having three or more layers can be employed.

One of the conductive layers 1312 formed over the insulating layer 652 is connected to the first conductive layer 622 of the memory element 614 or functions as the first conductive layer 622. Here, the one of the conductive layers 1312 functions as the first conductive layer as well. In other words, a part of the conductive layers 1312 corresponds to the first conductive layer 622. The one of the conductive layers 1312, which functions as the first conductive layer, can be provided so as to intersect with a wiring formed in the same layer as the gate electrode 1304. Thus, a multilayer wiring structure is formed. By stacking a plurality of insulating layers having a similar function to the insulating layer 652 and forming a wiring thereover, a multilayer structure can be formed. The conductive layers 1312 are preferably formed of a combination of a low resistance material such as aluminum (Al) and a barrier metal using a high melting point metal material such as titanium (Ti) or molybdenum (Mo). For example, a layered structure of titanium (Ti) and aluminum (Al), or a layered structure of molybdenum (Mo) and aluminum (Al) can be employed for the conductive layers 1312.

Alternatively, the transistor 680 may have a multi-gate structure which includes a semiconductor layer including at least two channel formation regions connected in series and at least two gate electrodes for applying electric field to each channel formation regions. Further alternatively, the transistor 680 may have a dual-gate structure where a semiconductor layer is interposed between upper and lower gate electrodes.

Figure 8B:
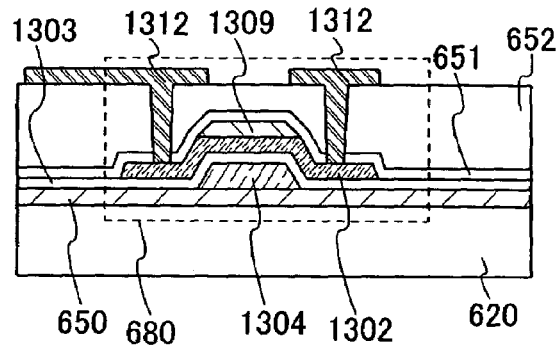

FIG. 8B shows an example of applying a bottom-gate type TFT. The transistor (TFT) 680 shown here includes a gate electrode 1304 provided over a base insulating layer 650, a gate insulating layer 1303 provided over the gate electrode 1304, a semiconductor layer 1302 provided over the gate insulating layer 1303, and a channel protective layer 1309 provided over the semiconductor layer 1302. Over the semiconductor layer 1302, insulating layers 651 and 652 functioning as interlayer insulating layers are provided over the semiconductor layer 1302. Further, the conductive layers 1312 connected to the semiconductor layer 1302 through the insulating layers 651 and 652 are provided. The conductive layers 1312 function as a source electrode and a drain electrode of the transistor 680. One of the conductive layers 1312 is connected to the first conductive layer 622 of the memory element 614 or functions as the first conductive layer 622. Although the conductive layers 1312 are formed through the insulating layer 652 and the insulating layer 651, they may be formed through only the insulating layer 651. In the case of the bottom-gate type TFT, the base insulating layer 650 need not necessarily be provided.

In the case where the substrate 620 is a flexible substrate, the substrate 620 has a lower allowable temperature limit as compared to a non-flexible substrate such as a glass substrate. Therefore, in the case of forming a transistor over a flexible substrate, an organic semiconductor is preferably used.

Figure 8C:
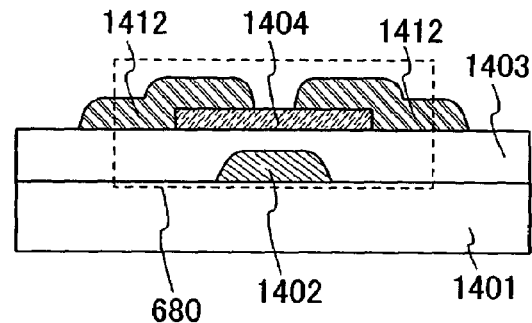

FIG. 8C shows an example of applying a staggered organic semiconductor transistor. The transistor 680 shown here is provided over a flexible substrate 1401. The transistor 680 includes a gate electrode 1402, a gate insulating layer 1403 provided over the gate electrode 1402, a semiconductor layer 1404 provided over the gate insulating layer 1403, and conductive layers 1412 connected to the semiconductor layer 1404. One of the conductive layers 1412 is connected the first conductive layer 622 of the memory element 614 or functions as the first conductive layer 622. Further, the semiconductor layer 1404 is partly interposed between the gate insulating layer 1403 and the first conductive layers 1412.

The gate electrode 1402 can be formed using a similar material and a similar method to those of the gate electrode 1304. Further, the gate electrode 1402 can also be formed by a droplet discharging method and by drying and baking. Alternatively, a paste containing a conductive fine particle is printed over a flexible substrate by a printing method and the paste is dried and baked so that the gate electrode 1402 can be formed. As a typical example of the conductive fine particle, a fine particle mainly containing any one of gold, copper, an alloy of gold and silver, an alloy of gold and copper, an alloy of silver and copper, and an alloy of gold, silver, and copper may be used. Alternatively, a fine particle mainly containing a conductive oxide such as indium tin oxide (ITO) may be used.

The gate insulating layer 1403 can be formed using a similar material and a similar method to those of the gate insulating layer 1303. Note that when an insulating layer is formed by heat treatment after application of a liquid insulating material, the heat treatment is performed at a lower temperature than an allowable temperature limit of the flexible substrate.

As a material of the semiconductor layer 1404 of the organic semiconductor transistor, a polycyclic aromatic compound, a conjugated double bond compound, phthalocyanine, a charge transfer complex, or the like can be given. For example, anthracene, tetracene, pentacene, 6T (hexathiophene), TCNQ (tetracyanoquinodimethane), PTCDA (a perylene carboxylic anhydrous compound), NTCDA (a naphthalenecarboxylic acid anhydrous compound), and the like can be given. Further, as a material for the semiconductor layer 1404 of the organic semiconductor transistor, a π-conjugated high molecular material such as an organic high molecular compound, carbon nanotube, polyvinyl pyridine, a phthalocyanine metal complex, or the like can be given. In particular, a π-conjugated high molecular material having a skeleton formed of a conjugated double bond such as polyacetylene, polyaniline, polypyrrole, polythienylene, a polythiophene derivative, poly(3alkylthiophene), a polyparaphenylene derivative, or a polyparaphenylenevinylene derivative, is preferably used.

As a method for forming the semiconductor layer 1404 of the organic semiconductor transistor, a method for forming a film having a uniform thickness over a substrate may be used. The thickness of the semiconductor layer 1404 is preferably set to be 1 nm or more and 1,000 nm or less, and more preferably, 10 nm or more and 100 nm or less. As a specific method, an evaporation method, a coating method, a spin coating method, an overcoat method, a solution casting method, a dipping method, a screen-printing method, a roll coater method, or a droplet discharging method can be used.

Figure 8D:
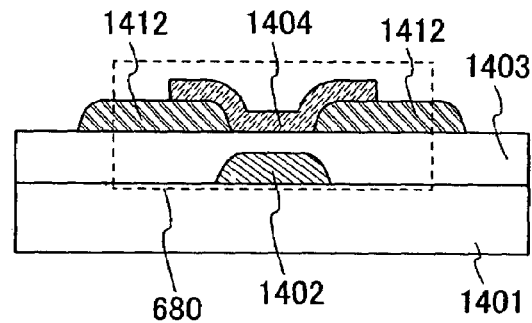

FIG. 8D shows an example of applying a coplanar type organic semiconductor transistor. The transistor 680 shown here is provided over a flexible substrate 1401. The transistor 680 includes a gate electrode 1402, a gate insulating layer 1403 provided over the gate electrode 1402, conductive layers 1412 provided over the gate insulating layer 1403, and a semiconductor layer 1404 provided over a part of the conductive layers 1412 and the gate insulating layer 1403. One of the conductive layers 1412 is connected to the first conductive layer 622 of the memory element 614 or functions as the first conductive layer 622. Further, each of the first conductive layers 1412 is partly interposed between the gate insulating layer 1403 and the semiconductor layer 1404.

Further, the thin film transistors and the organic semiconductor transistors shown in FIGS. 8A to 8D may be provided to have any structure as long as they can serve as switching elements.

Furthermore, a transistor may be formed using a single crystalline substrate or an SOI substrate, and a memory element may be provided thereover. The SOI substrate may be formed by using a method in which a wafer is attached, or a method called SIMOX in which an insulating layer is formed in an interior portion of an Si substrate by implanting an oxygen ion. Here, as shown in FIG. 7C, the memory element 614 is connected to a field effect transistor 662 provided over a single crystalline semiconductor substrate 660. Specifically, a conductive layer 663 connected to an impurity region of the field effect transistor 662 is connected to a first conductive layer 622 through an insulating layer 672. In other words, the insulating layer 672 is provided so as to cover the conductive layer 663 serving as a source electrode or a drain electrode of the field effect transistor 662, and the memory element 614 is provided over the insulating layer 672. Note that the field effect transistors 662 are separated from each other by a field oxide film 661.

Since the transistor formed using such a single crystalline semiconductor has excellent characteristics such as high response speed and good mobility, the transistor can operate at high speed. Further, such transistors have only little variation in its characteristics, and therefore, a highly-reliable semiconductor device can be provided.

Further, when the insulating layer 672 is provided over the field effect transistor 662 and the memory element 614 is formed thereover, the first conductive layer 662 can be disposed freely. That is, although the memory element 614 needs to be provided in a region except a region over the transistor 680 in the structure of FIGS. 7A and 7B, the structure as shown in FIG. 7C enables the memory element 614 to be provided over the transistor 662 which is provided in a layer 671 having a transistor.

Figure 7C:
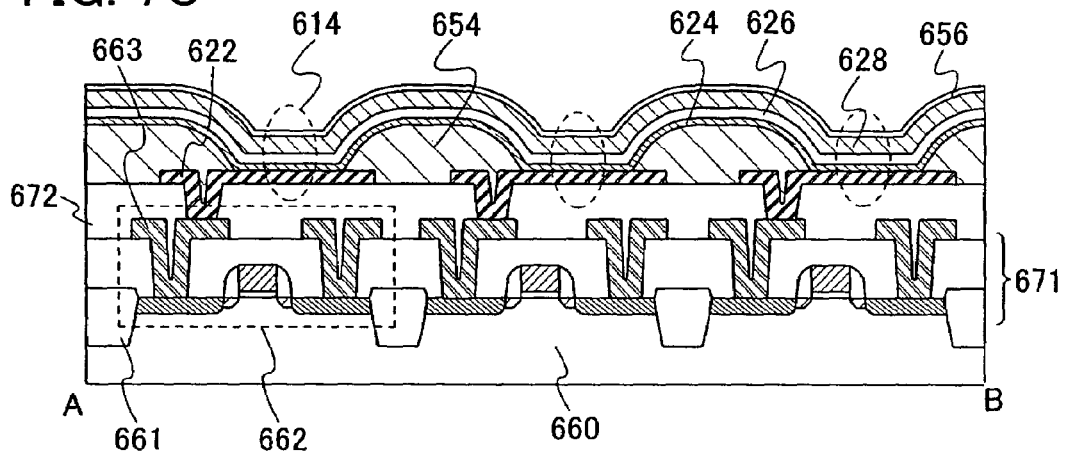

In each of FIGS. 7B and 7C, the organic compound layer 626 is provided over an entire surface of the substrate. However, the organic compound layer 626 may be selectively provided only in memory cells. In this case, an organic compound is discharged by a droplet discharging method or the like and baked to selectively form organic compound layers, making it possible to improve material use efficiency.

The memory element 614 can be formed similarly using any of the materials and the methods shown in Embodiment Mode 1 or 2.

The partition wall layer 654 can be formed using a similar material and a similar method to those of the partition wall layers 56 and 64 described in Embodiment Mode 2.

Figure 9:
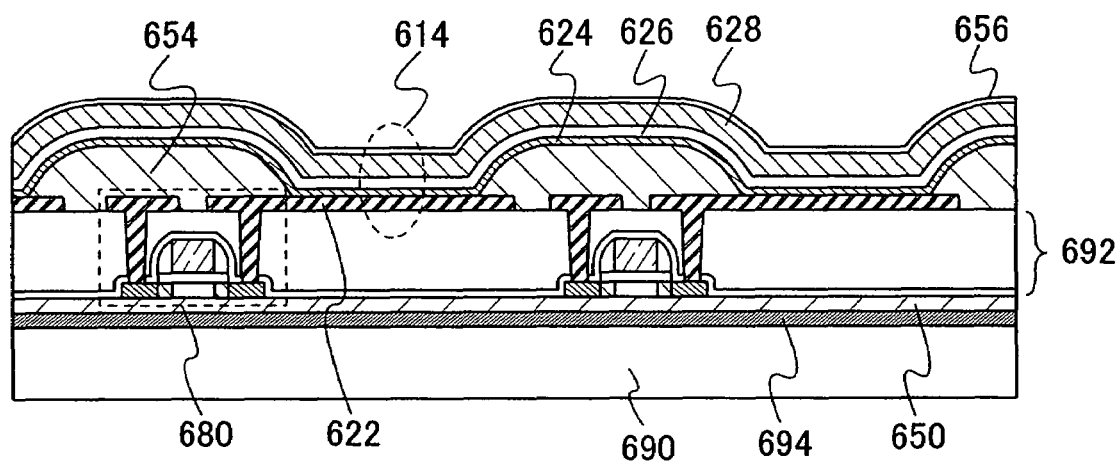
FIG. 9 is a cross-sectional view of an example of a semiconductor device of the present invention.

As shown in FIG. 9, after a separation layer is provided over a substrate having an insulated surface and a layer 692 having a transistor and a memory element 614 are provided over the separation layer, the layer 692 having a transistor and the memory element 614 may be separated from the separation layer and may be attached to a substrate 690 with an adhesive layer 694 interposed therebetween. As a separation method, the following methods or the like can be employed: (1) a metal oxide layer is provided as a separation layer between a substrate having high heat resistance and a layer having a transistor, and the metal oxide layer is weakened by crystallization so as to separate the layer having a transistor from the substrate; (2) an amorphous silicon film containing hydrogen is provided as a separation layer between a substrate having high heat resistance and a layer having a transistor, and hydrogen gas contained in the amorphous silicon, film is released by laser irradiation so as to separate the substrate having high heat resistance, or an amorphous silicon film is provided as a separation layer and the amorphous silicon film is removed by etching so as to separate the layer having a transistor; (3) a substrate having high heat resistance over which a layer having a transistor is provided, is mechanically removed or removed by etching with the use of a solution; and (4) after providing a metal layer and a metal oxide layer as separation layers between a substrate having high heat resistance and a layer having a transistor, weakening the metal oxide layer by crystallization, and removing a part of the meal layer by etching with the use of a solution or halogen fluoride gas such as $NF_3$, $BrF_3$, or $ClF_3$, physical separation is conducted in the weakened metal oxide layer.

When a flexible substrate, a film having a thermoplastic property, a paper containing a fibrous material, or the like is used as the substrate 690, a small, thin, and lightweight memory device can be realized.

Figure 6B:
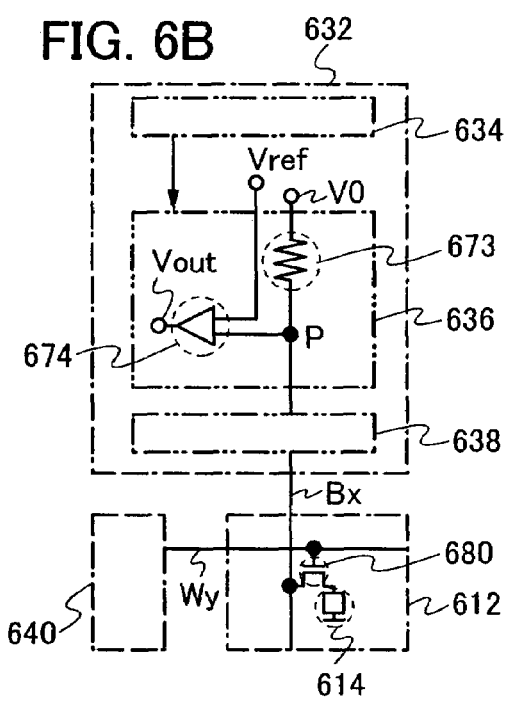
Figure 6C:
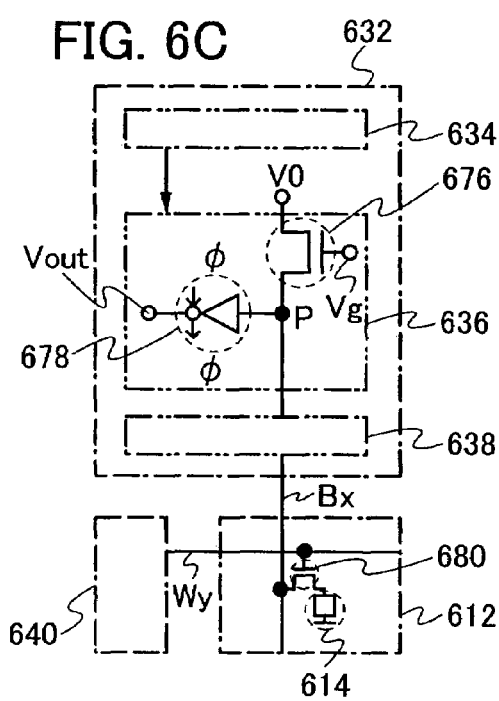

Next, specific operation when conducting data writing in a memory device of the present invention will be described with reference to FIGS. 6A to 6C. Note that writing is conducted by changing an electrical property of a memory cell, and it is assumed that an initial state (state where an electric action is not applied) of the memory cell is data "0", and a state where the electrical property is changed is data "1".

Here, a case where data is written in the memory cell 612 in the third column and the third row will be described. When data "1" is written in the memory cell 612, the memory cell 612 is selected by the row decoder 642, the column decoder 634 and the selector 638. Specifically, predetermined voltage V22 is applied to a word line W3 connected to the memory cell 612 by the row decoder 642. Further, a bit line B3 connected to the memory cell 612 is connected to the reading/writing circuit 636 by the column decoder 634 and the selector 638. Then, writing voltage V21 is output to the bit line B3 from the reading/writing circuit 636.

Thus, the transistor 680 forming the selected memory cell 612 is made in an ON state, and the bit line is electrically connected to the memory element 614, and voltage Vw (Vw is almost equal to Vcom−V21) is applied. Further, one of electrodes of the memory element 614 is connected to a common electrode having a potential Vcom. By appropriately selecting the potential Vw, a mixture is formed in a portion where the first conductive layer and the liquid crystal layer included in the memory element 614 have contact with each other, and the organic compound layer provided between the liquid crystal layer and the second conductive layer is physically or electrically changed, and thus, the data "1" can be written. Specifically, at reading operation voltage, electric resistance between the first conductive layer and the second conductive layer in the state of the data "1" is preferably reduced significantly as compared to that in a state of the data "0", or a short circuit may simply be generated between the first conductive layer and the second conductive layer. Note that the potential V21 may be appropriately selected from 5 to 15V, the potential V22 may be appropriately selected from 5 to 15 V, and the potential Vcom may be set at 0 V. Alternatively, the potential V21 may be appropriately selected from −12 to 0 V, the potential V22 may be appropriately selected from −12 to 0 V, and the potential Vcom may be appropriately selected from 3 to 5 V. The voltage Vw may be set to be 5 to 15 V, or −5 to −15 V.

Note that non-selected word lines and non-selected bit lines are controlled such that the data "1" is not written in the memory cells connected to the non-selected word and bit lines. Specifically, a potential (e.g., 0 V) by which transistors of memory cells connected to the non-selected word lines are made in an OFF state, may be applied to the non-selected word lines whereas the non-selected bit lines may be made in a floating state or applied with a potential, which is the same level as Vcom.

On the other hand, when the data "0" is written in the memory cell 612, no electric action may be applied to the memory cell 612. In circuit operation, for example, in a similar manner to the case of writing the data "1", the memory cell 612 is selected by the row decoder 642, the column decoder 634 and the selector 638; however, an output potential, which is the same level as Vcom, is applied to the bit line B3 from the reading/writing circuit 636, or the bit line B3 is made to be in a floating state. Then, low voltage (e.g., about −5 to 5 V) is applied to the memory element 614, or no voltage is applied to the memory element 614, and an electric characteristic of the memory element is not changed and writing of the data "0" can be realized.

Next, operation in reading data by an electric action will be described. Data is read by utilizing difference in electric characteristics of the memory elements 614 between a memory cell having data "0" and a memory cell having data "1". For example, a method for reading data by utilizing difference in electric resistance will be described under conditions where electric resistance of a memory element forming a memory cell having the data "0" is assumed to be R0 at reading voltage, and electric resistance of a memory element forming a memory cell having the data "1" is assumed to be R1 at reading voltage. It is assumed that the relation, R1<<R0, is made. As a structure of a reading portion of the reading/writing circuit, for example, the reading/writing circuit 636 including the resistor element 673 and the differential amplifier 674 shown in FIG. 6B can be given. The resistor element has a resistance value Rr, and it is assumed that the relation, R1<Rr<R0, is made. As shown in FIG. 6C, a transistor 676 may be provided instead of the resistor element 673 and a clocked inverter 678 may be provided instead of the differential amplifier 674. The circuit configuration is not limited to those in FIGS. 6B and 6C.

When data is read from the memory cell 612 in the x-th column and the y-th row, the memory cell 612 is selected by the row decoder 642, the column decoder 634, and the selector 638. Specifically, predetermined voltage V24 is applied to a word line Wy connected to the memory cell 612 by the row decoder 642, and the transistor 680 is turned on. A bit line Bx connected to the memory cell 612 is connected to a terminal P of the reading/writing circuit 636 by the column decoder 634 and the selector 638. As a result, a potential Vp of the terminal P becomes a value which is determined by resistance division of Vcom and V0 by the resistor element 673 (resistance value Rr) and the memory element 614 (resistance value R0 or R1). Therefore, in the case where the memory cell 612 has the data "0", Vp0=Vcom+(V0−Vcom)×R0/(R0+Rr). When the memory cell 612 has the data "1", Vp1=Vcom+(V0−Vcom)×R1/(R1+Rr). As a result, Vref is selected so as to have a value between the Vp0 and the Vp1 in FIG. 6B, and a point of change of the clocked inverter 678 is selected so as to be between the Vp0 and the Vp1 in FIG. 6C. Accordingly, Low/High (or High/Low) is output as an output potential Vout in accordance with the data "0" or data "1", thereby conducting data reading.

For example, it is assumed that the differential amplifier 674 is operated at Vdd=3V, and the Vcom is set to be 0 V; the V0 is set to be 3 V; and the Vref is set to be 1.5 V. If R0/Rr=Rr/R1=9 and on-resistance of the transistor 680 can be ignored, in a case where a memory cell has the data "0", Vp0 is 2.7 V and High is output as the Vout. Meanwhile, in the case where the memory cell has the data "1", the Vp1 is 0.3 V and Low is output as the Vout. Thus, data reading from the memory cell can be conducted.

According to the aforementioned method, reading is conducted with a voltage value by utilizing a difference in the resistance value of the memory element 614 and resistance division. Needless to say, the reading method is not limited to this. For example, other than using the difference in an electrical resistance, reading may be conducted by using the difference in a current value. Alternatively, in the case where the electrical characteristic of the memory cell has a diode characteristic in which threshold voltage varies between the data "0" and "1," the difference in the threshold voltages may be used for reading.

This embodiment mode can be freely implemented in combination with any of the above embodiment modes.

According to the present invention, initial defects of a memory element can be reduced and yield in manufacturing a semiconductor device including the memory element can be improved.

According to the present invention, it is possible to provide a semiconductor device including a memory element in which writing at a time other than a manufacturing process (additional recording) of data is possible and forgery caused by rewriting of data can be prevented.

EMBODIMENT MODE 4

In Embodiment Mode 4, a memory element, a semiconductor device including the memory element according to the present invention, manufacturing method thereof, and examples of applying the semiconductor device will be described with reference to FIGS. 10A to 16.

The semiconductor device described in this embodiment mode has a feature that reading and writing data are possible without contact. Transmission formats of data are roughly classified into three types, which are: an electromagnetic coupling type which conducts communication through mutual induction by positioning a pair of coils so as to face each other; an electromagnetic induction type which conducts communication through an induction field; and an electric wave type which conducts communication by utilizing electric waves. Any type may be used. Moreover, an antenna used for the data transmission can be provided in two ways: one is that the antenna is provided over a substrate where a transistor and a memory element are provided, and the other is that a terminal portion is provided over a substrate where a transistor and a memory element are provided and an antenna provided over another substrate is connected to the terminal portion. Here, as a portion of a cross section of a semiconductor device, a part of an antenna, a circuit connected to the antenna, and a memory circuit is shown.

First, a structural example of a semiconductor device in which an antenna is provided over a substrate where a plurality of semiconductor elements and memory elements are provided is described with reference to FIGS. 10A and 10B.

FIG. 10A shows a semiconductor device including a transistor 1451, a transistor 1452 and a layer 1250 having transistors, which are formed over a substrate 1350; and a memory element portion 1352 and a conductive layer 1353 functioning as an antenna, which are formed over the layer 1250 having transistors.

Although the case is shown where the memory element portion 1352 and the conductive layer 1353 functioning as an antenna are formed over an insulating layer 1252, the structure of the present invention is not limited to this. For example, the memory element portion 1352 or the conductive layer 1353 functioning as an antenna may be provided below or in the same layer as the layer 1250 having transistors.

The memory element portion 1352 includes a memory element 1351a and a memory element 1351b. The memory element 1351a includes a first conductive layer 1361a formed over the insulating layer 1252, a liquid crystal layer 1362a formed over the first conductive layer 1361a, an organic compound layer 1363a formed over the liquid crystal layer 1362a, and a second conductive layer 1364a formed over the organic compound layer 1363a. Similarly, the memory element 1351b includes a first conductive layer 1361b formed over the insulating layer 1252, a liquid crystal layer 1362b formed over the first conductive layer 1361b, an organic compound layer 1363b formed over the liquid crystal layer 1362b, and a second conductive layer 1364b formed over the organic compound layer 1363b.

An insulating layer 1366 functioning as a protective film is formed covering the memory elements 1351a and 1351b and the conductive layer 1353 functioning as an antenna. The memory element portion 1352 can be formed by using a similar material or a similar manufacturing method to that of the memory element shown in any of the above embodiment modes.

Here, the conductive layer 1353 functioning as an antenna is provided over the conductive layer 1360 which is formed in the same layer as the second conductive layers 1364a and 1364b. A conductive layer functioning as an antenna may be formed in the same layer as the second conductive layers 1364a and 1364b. The conductive layer 1353 functioning as an antenna is connected to a source wire or a drain wire of the transistor 1451. The transistor 1451 forms a part of a circuit connected to the antenna.

The transistor 1452 forms a part of a driver circuit which controls operation of the memory element portion 1352. The driver circuit is provided with a plurality of transistors, for example, a decoder, a buffer, and the like.

The conductive layer 1353 functioning as an antenna can be formed with one kind of element selected from gold (Au), platinum (Pt), nickel (Ni), tungsten (W), molybdenum (Mo), cobalt (Co), copper (Cu), aluminum (Al), manganese (Mn), titanium (Ti), and the like; an alloy including a plurality of the elements; or the like. Also, as a formation method of the conductive layer 1353 functioning as an antenna, an evaporation method, a sputtering method, various printing methods such as screen printing and gravure printing, a droplet discharging method, or the like can be used.

As the transistors 1451 and 1452 included in the layer 1250 having transistors, the transistor 680 described in Embodiment Mode 3 can be appropriately used.

After a separation layer, the layer 1250 having transistors, the memory element portion 1352 and the conductive layer 1353 functioning as an antenna are formed over a substrate, the layer 1250 having transistors, the memory element portion 1352 and the conductive layer 1353 functioning as an antenna may be peeled by appropriately using the peeling method shown in Embodiment Mode 3 and pasted onto another substrate with an adhesive layer. As the latter substrate, a flexible substrate, a film having a thermoplastic property, paper containing a fibrous material, a base material film, or the like is used, whereby achieving reduction in size, thickness, and weight of the memory device.

FIG. 10B shows an example of the semiconductor device, different from that shown in FIG. 10A. Note that with reference to FIG. 10B, parts different from the parts in FIG. 10A will be described.

The semiconductor device shown in FIG. 10B includes the layer 1250 having transistors over the substrate 1350 and a memory element portion 1355 and the conductive layer 1353 functioning as an antenna over the layer 1250 having transistors. Here, the case is shown where transistors 1453 and 1454 functioning as switching elements of the memory element portion 1355 are included in the same layer as the transistors 1451 and 1452 and the memory element portion 1355 and the conductive layer 1353 functioning as an antenna are provided over the layer 1250 having transistors. However, the structure is not limited to this, and the memory element portion 1355 and the conductive layer 1353 functioning as an antenna can be provided below or in the same layer as the layer 1250 having transistors.

The memory element portion 1355 includes a memory element 1356a and a memory element 1356b. The memory element 1356a includes a first conductive layer 1371a formed over the insulating layer 1252, a liquid crystal layer 1370 formed over the first conductive layer 1371a, an organic compound layer 1372 formed over the liquid crystal layer 1370, and a second conductive layer 1373 formed over the organic compound layer 1372. Similarly, the memory element 1356b includes a first conductive layer 1371b formed over the insulating layer 1252, the liquid crystal layer 1370 formed over the first conductive layer 1371b, the organic compound layer 1372 formed over the liquid crystal layer 1370, and the second conductive layer 1373 formed over the organic compound layer 1372. An end portion of the first conductive layer 1371a of the memory element 1356a and an end portion of the first conductive layer 1371b of the memory element 1356b are covered by a partition wall layer 1374.

The memory elements 1356a and 1356b have the liquid crystal layer 1370, the organic compound layer 1372 and the second conductive layer 1373 in common. That is, over the first conductive layers 1371a and 1371b and the partition wall layer 1374 which covers the end portions of the first conductive layers 1371a and 1371b, the liquid crystal layer 1370, the organic compound layer 1372, and the second conductive layer 1373 are sequentially provided.

Further, the memory element 1356a is connected to the transistor 1454, and the memory element 1356b is connected to the transistor 1453. Specifically, the first conductive layer 1371a is connected to a source wire or a drain wire of the transistor 1454. Similarly, the first conductive layer 1371b is connected to a source wire or a drain wire of the transistor 1453.

Moreover, the insulating layer 1366 functioning as a protective film is formed to cover the memory elements 1356a and 1356b and the conductive layer 1353 functioning as an antenna. The memory element portion 1355 can be formed by using a similar material or a similar manufacturing method to those of the memory elements shown in the above embodiment modes.

The memory elements 1356a and 1356b can be formed with the use of the material and manufacturing method described in any of Embodiment Modes 1 to 3.

The layer 1250 having transistors, the memory element portion 1355 and the conductive layer 1353 functioning as an antenna can be formed by an evaporation method, a sputtering method, a CVD method, a printing method, a droplet discharging method, or the like as described above. Different methods may be employed depending on location.

After a separation layer, the layer 1250 having transistors, the memory element portion 1355, and the conductive layer 1353 functioning as an antenna are formed over the substrate, the layer 1250 having transistors, the memory element portion 1355 and the conductive layer 1353 functioning as an antenna may be peeled by appropriately using the peeling method described in Embodiment Mode 3 and pasted to another substrate with an adhesive layer. As the latter substrate, a flexible substrate, a film having a thermoplastic property, paper containing a fibrous material, a base material film, or the like is used, whereby achieving reduction in size, thickness, and weight of the memory device.

A sensor may be provided over the same substrate. As the sensor, an element which detects temperature, humidity, illuminance, gas, gravity, pressure, sound (vibration), acceleration, or other characteristics by a physical or chemical means is given. The sensor is typically formed by an element such as a resistor element, a capacitively coupled element, an inductively coupled element, a photovoltaic element, a photoelectric conversion element, a thermo-electromotive force element, a transistor, a thermistor, a diode, a capacitance element, or a piezoelectric element.

Next, an example of a manufacturing method of a memory element and a semiconductor device including the memory element of the present invention will be described with reference to FIGS. 11A to 14. Here, a manufacturing method of a semiconductor device such as an IC tag or an RFID tag using the semiconductor device shown in FIG. 10B will be described.

Figure 11A:
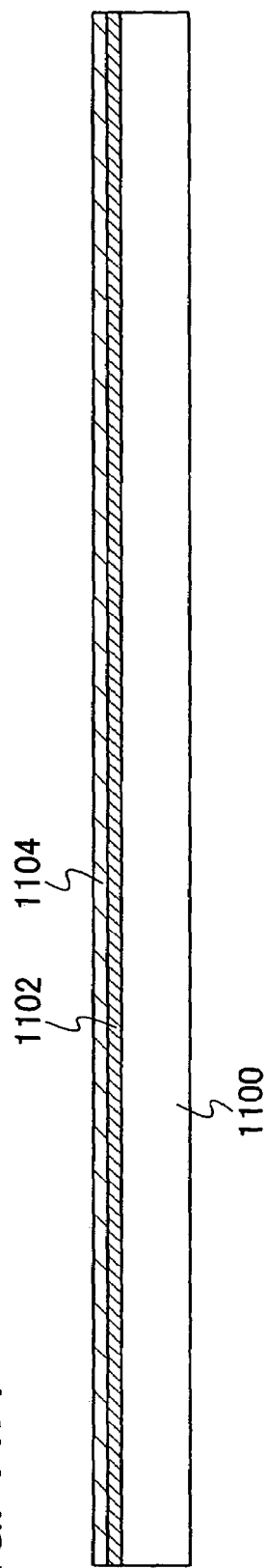
FIGS. 11A and 11B show an example of a manufacturing method of a semiconductor device of the present invention.

Over one surface of a substrate 1100, a separation layer 1102 is formed (see FIG. 11A). As the substrate 1100, a glass substrate; a quartz substrate; a metal substrate or a stainless steel substrate each having one surface on which an insulating film is formed; a plastic substrate which can resist the heat treatment temperature of the present process; or the like can be used. The separation layer 1102 is provided entirely over the substrate 1100; however, the present invention is not particularly limited to this. For example, the separation layer 1102 may be selectively provided by a photolithography technique or an etching method. Further, although the separation layer 1102 is formed so as to be in contact with the substrate 1100, an insulating layer to be a base may be formed in contact with the substrate 1100 and the separation layer 1102 may be formed in contact with the insulating layer, as appropriate.

As the separation layer 1102, a single layer or stacked layers of a layer containing an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), lead (Pb), osmium (Os), iridium (Ir) or silicon (Si), or an alloy material or a compound material containing the element as its main component, by a sputtering method, a plasma CVD method, or the like. The crystal structure of a layer containing silicon may be either amorphous, microcrystalline, or polycrystalline.

In the case where the separation layer 1102 has a single layer structure, a tungsten layer, a molybdenum layer or a layer containing a mixture of tungsten and molybdenum is preferably formed. Alternatively, a layer containing an oxide or oxynitride of tungsten, a layer containing an oxide or oxynitride of molybdenum, or a layer containing an oxide or oxynitride of a mixture of tungsten and molybdenum is formed. The mixture of tungsten and molybdenum corresponds to an alloy of tungsten and molybdenum, for example. In addition, the oxide of tungsten is also referred to as tungsten oxide.

In the case where the separation layer 1102 has a layered structure, a tungsten layer, a molybdenum layer or a layer containing a mixture of tungsten and molybdenum is preferably formed as a first layer of the separation layer 1102. Then, as a second layer, an oxide, nitride, oxynitride or nitride oxide of tungsten, molybdenum or a mixture of tungsten and molybdenum is formed.

When a layered structure of a layer containing tungsten and a layer containing an oxide of tungsten is formed for the separation layer 1102, the following method may be employed: the layer containing tungsten is formed and then a layer containing silicon oxide is formed thereover so that the layer containing the oxide of tungsten is formed at an interface between the tungsten layer and the layer containing silicon oxide. This method can be applied to the cases of forming layers containing nitride, oxynitride, and nitride oxide of tungsten, and after forming the layer containing tungsten, an insulating layer containing silicon nitride, silicon oxide or other silicon is formed thereover. Note that the insulating layer or the like containing silicon nitride, silicon oxide, or other silicon formed over the layer containing tungsten later functions as an insulating layer serving as a base.

The oxide of tungsten is expressed by $WO_x$, and x is 0 or more and 3 or less (note that x≠0). There are cases of x=2 ($WO_2$), x=2.5 ($W_2O_5$), x=2.75 ($W_4O_{11}$), x=3 ($WO_3$), and the like. When forming an oxide of tungsten, the value of x described above is not particularly restricted and may be decided based on the etching rate or the like. Note that a layer containing an oxide of tungsten, which is formed by a sputtering method in an oxygen atmosphere, ($WO_x$, 0<x<3) can be formed with the best etching rate. Thus, in order to reduce manufacturing time, the separation layer is preferably formed using a layer containing the oxide of tungsten by a sputtering method in an oxygen atmosphere.

Next, a base insulating layer 1104 is formed to cover the separation layer 1102. The base insulating layer 1104 is formed with a single layer structure or layered structure including an insulating film of silicon nitride, silicon oxide, or other silicon by a thin film formation method such as a sputtering method or a plasma CVD method. The base insulating layer can also function as a blocking layer which prevents an impurity from entering from the substrate 1100.

Figure 11B:
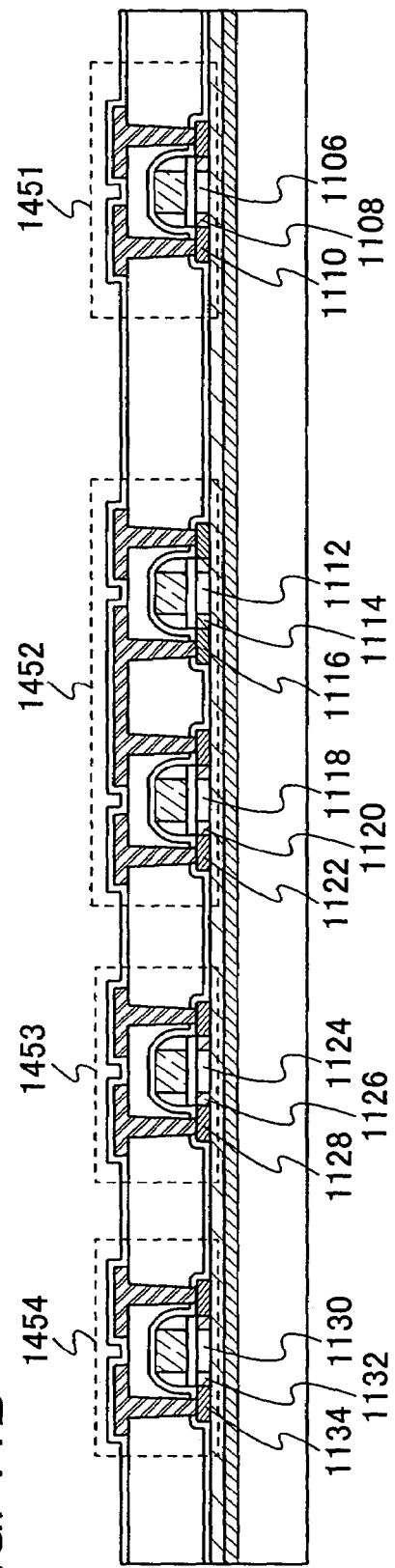

Next, similarly to the transistor 680 shown in Embodiment Mode 3, transistors 1451, 1452, 1453 and 1454 are formed (see FIG. 11B). Here, top-gate type thin film transistors shown in FIG. 8A are manufactured. Specifically, a semiconductor layer is formed over a base insulating layer, a gate insulating layer is formed over the semiconductor layer, a gate electrode and side walls are formed over the gate insulating layer, and an insulating layer which covers the semiconductor layer, the gate electrode and the side walls is formed. Then, a conductive layer which is connected to the semiconductor layer and functions as a source wire and a drain wire is formed.

Each of the transistors 1451, 1452, 1453 and 1454 is added with an impurity element having one conductivity type, and includes a semiconductor layer in which a channel formation region, a pair of first impurity regions functioning as low concentration impurity regions (also referred to as LDD regions) and a pair of second impurity regions; one of which functions as a source region and the other functions as a drain region. The impurity concentration of the second impurity regions is higher than that of the first impurity regions. The present invention is not particularly limited to this and the first impurity regions need not necessarily be provided.

Here, a channel formation region 1106, a pair of first impurity regions 1108 and a pair of second impurity regions 1110 are formed in the transistor 1451. The transistor 1452 includes two transistors added with impurity elements having different conductivity types from each other. In one of the transistors of the transistor 1452, a channel formation region 1112, a pair of first impurity regions 1114, and a pair of second impurity regions 1116 are formed, whereas in the other transistor, a channel formation region 1118, a pair of first impurity regions 1120, and a pair of second impurity regions 1122 are formed. In the transistor 1452, the first impurity regions 1114 and the second impurity regions 1116, and the first impurity regions 1120 and the second impurity regions 1122 are formed by being added with impurity elements having different conductivity types. In the transistor 1453, a channel formation region 1124, a pair of first impurity regions 1126 and a pair of second impurity regions 1128 are formed. In the transistor 1454, a channel formation region 1130, a pair of first impurity regions 1132 and a pair of second impurity regions 1134 are formed.

Next, an insulating layer 1136 and an insulating layer 1252 are stacked and formed over the conductive layers functioning as source wires and drain wires of the transistors 1451, 1452, 1453 and 1454 (see FIG. 12A). The insulating layer 1136 and the insulating layer 1252 are formed by using an inorganic insulating material such as silicon oxide or silicon oxynitride, or an organic insulating material such as an acrylic resin or a polyimide resin. When a coating method such as spin coating or roll coater is used, an insulating layer including silicon oxide, which is formed by applying a liquid insulating material and subjecting the liquid material to heat treatment, can also be used. For example, a material containing a siloxane bond is applied and is subjected to heat treatment at 200 to 400° C. so that an insulating layer including silicon oxide can be obtained. When an insulating layer formed by a coating method or an insulating layer which is planarized by reflow is formed as the insulating layers 1136 and 1252, disconnection of a wire (here, first conductive layers of memory elements, and a conductive layer which connects a conductive layer functioning as an antenna to the transistor) provided over the insulating layers can be prevented. Although a two-layered structure is formed here as an interlayer insulating layer, the present invention is not particularly limited and a single layer structure or a layered structure having three or more layers can be formed. When the insulating layer 1136 having contact with the transistors is formed of an inorganic insulating material such as silicon oxide or silicon oxynitride, the insulating layer 1136 can function as a protective layer.

Next, the insulating layers 1136 and 1252 are etched by a photolithography technique to form contact holes which expose the conductive layers functioning as source wires or drain wires of the transistors 1451, 1453 and 1454. Then, a conductive layer is formed over the insulating layer 1252 so as to fill the contact holes. The conductive layer is formed of a metal, an alloy thereof, a metal compound, or a conductive oxide material by a sputtering method, a printing method or a droplet discharging method. Specifically, a metal such as gold (Au), silver (Ag), platinum (Pt), nickel (Ni), tungsten (W), chromium (Cr), molybdenum (Mo), iron (Fe), cobalt (Co), copper (Cu), palladium (Pd), carbon (C), aluminum (Al), manganese (Mn), titanium (Ti) or tantalum (Ta); an alloy thereof; an alkali metal such as lithium (Li) or cesium (Cs); an alkaline earth metal such as magnesium (Mg), calcium (Ca) or strontium (Sr); an alloy containing either the alkali metal or the alkaline earth metal (such as MgAg or AlLi); a rare earth metal such as europium (Er) or ytterbium (Yb); or an alloy containing the rare earth metal can be used. Alternatively, a metal compound such as titanium nitride (TiN), tungsten nitride (WN) or molybdenum nitride (MoN) can be used. Further alternatively, a conductive oxide material such as indium tin oxide (ITO), zinc oxide (ZnO), indium zinc oxide (IZO), zinc oxide to which gallium is added (GZO), or indium tin oxide including silicon oxide (ITSO) can be used. Alternatively, the conductive layer can also be formed by a sputtering method, using a target of indium oxide including silicon oxide in which 2 to 20 wt % of zinc oxide (ZnO) is mixed.

The conductive layer formed in the above-described manner is processed by a photolithography technique or an etching method to form a first conductive layer 1371a and a first conductive layer 1371b each of which forms a memory element, and a conductive layer 1138. The first conductive layer 1371a is connected to a source wire or a drain wire of the transistor 1454. The first conductive layer 1371b is connected to a source wire or a drain wire of the transistor 1453. The conductive layer 1138 functions as a wire which connects the transistor 1451 to an antenna to be formed later.

Next, an insulating layer is formed to cover the first conductive layer 1371a, the first conductive layer 1371b and the conductive layer 1138. The insulating layer is formed of an inorganic insulating material such as silicon oxide or silicon nitride, an organic insulating material such as an acrylic resin, a polyimide resin or other resist materials, or a material including a siloxane bond. The insulating layer is formed by a sputtering method, a CVD method, a coating method, or the like in accordance with the used material.

Then, the insulating layer is etched by a photolithography technique or an etching method to expose the first conductive layer 1371a and the first conductive layer 1371b. The remaining insulating layer at this time is called a partition wall layer 1374. The partition wall layer 1374 is formed to cover end portions of the first conductive layer 1371a and the first conductive layer 1371b. In a part of the insulating layer over the conductive layer 1138, a contact hole having a size with which a wire can be formed so that a part of the conductive layer 1138 is exposed. In the case where a positive type photosensitive resin, of which an unexposed portion remains when light exposure is conducted, is used for the insulating layer, the insulating layer can be formed by only a photolithography technique, thereby reducing the number of steps.

Next, a liquid crystal layer 1370 is formed over the first conductive layer 1371a and the first conductive layer 1371b. The liquid crystal layer 1370 is formed of a compound which can exhibit liquid crystallinity by a droplet discharging method, an inkjet method, an evaporation method or a spin coating method. The compound which can exhibit liquid crystallinity used here is a compound which transfers at least from a first phase to a second phase by temperature change. Further, it is a compound which exhibits liquid crystallinity and forms a mixture with the first conductive layers 1371a and 1371b which are in contact with the liquid crystal layer.

Further, an organic compound layer 1372 is formed over the liquid crystal layer 1370. The organic compound layer 1372 is formed using an organic compound whose crystal state, resistance value, or shape as a layer varies by electric action, by an evaporation method, an electron beam evaporation method, a sputtering method or a CVD method. Specifically, an organic resin such as polyimides, polyacrylic ester or polymethacrylic acid ester, an organic compound having a hole transporting property or an organic compound having an electron transporting property can be used. In the case of forming the organic compound layer 1372 by using a plurality of materials, the organic compound layer 1372 can be formed by depositing each of the materials at the same time. For example, the organic compound layer 1372 can be formed by combining the same type of methods or different types of methods, such as co-evaporation by resistance-heating evaporations, co-evaporation by electron beam evaporations, co-evaporation by resistance-heating evaporation and electron beam evaporation, deposition by resistance-heating evaporation and sputtering, or deposition by electron beam evaporation and sputtering.

Next, a second conductive layer 1373 is formed over the organic compound layer 1372. The second conductive layer 1373 is formed of a metal, an alloy thereof, a metal compound or a conductive oxide material by a sputtering method, a printing method or a droplet discharging method. Specifically, a metal such as gold (Au), silver (Ag), platinum (Pt), nickel (Ni), tungsten (W), chromium (Cr), molybdenum (Mo), iron (Fe), cobalt (Co), copper (Cu), palladium (Pd), carbon (C), aluminum (Al), manganese (Mn), titanium (Ti) or tantalum (Ta); an alloy thereof; an alkali metal such as lithium (Li) or cesium (Cs); an alkaline earth metal such as magnesium (Mg), calcium (Ca) or strontium (Sr); an alloy containing either the alkali metal or the alkaline earth metal (such as MgAg or AlLi); a rare earth metal such as europium (Er) or ytterbium (Yb); or an alloy containing the rare earth metal can be used. Alternatively, a metal compound such as titanium nitride (TiN), tungsten nitride (WN) or molybdenum nitride (MoN) can be used. Further alternatively, a conductive oxide material such as indium tin oxide (ITO), zinc oxide (ZnO), indium zinc oxide (IZO), zinc oxide to which gallium is added (GZO), or indium tin oxide including silicon oxide (ITSO) can be used. Alternatively, the second conductive layer 1373 can also be formed by a sputtering method, using a target of indium oxide including silicon oxide in which 2 to 20 wt % of zinc oxide (ZnO) is mixed.

A conductive layer 1360 is formed at the same time as the second conductive layer 1373. The conductive layer 1360 is formed so as to fill the contact hole which is formed to expose the conductive layer 1138.

Here, the liquid crystal layer 1370, the organic compound layer 1372 and the second conductive layer 1373 are sequentially formed over the first conductive layers 1371a and 1371b and the partition wall layer 1374 which covers the end portions of the first conductive layers 1371a and 1371b, as common layers. However, they may be selectively formed over each of the first conductive layer 1371a and the first conductive layer 1371b.

Next, a conductive layer 1353 functioning as an antenna is formed in contact with the conductive layer 1360. The conductive layer 1353 is formed of a conductive material by an evaporation method, a sputtering method, various printing methods such as screen printing or gravure printing or a droplet discharging method. Specifically, the conductive layer 1353 is formed of a single layer or stacked layers including an element selected from gold (Au), platinum (Pt), nickel (Ni), tungsten (W), molybdenum (Mo), cobalt (Co), copper (Cu), aluminum (Al), manganese (Mn) or titanium (Ti), or an alloy material or a compound material containing the element as its main component.

Then, an insulating layer 1366 and an insulating layer 1140 are formed over the second conductive layer 1373, the partition wall layer 1374, the conductive layer 1360 and the conductive layer 1353. The insulating layer 1366 functions as a protective layer, and the insulating layer 1140 formed over the insulating layer 1366 functions as a planarization layer. The insulating layer 1366 and the insulating layer 1140 are formed of an inorganic insulating material such as silicon oxide or silicon oxynitride, an organic insulating material such as an acrylic resin or a polyimide resin, or a material including a siloxane bond by a sputtering method, a CVD method or a coating method. The insulating layer 1366 is preferably formed of an inorganic insulating material such as silicon oxide or silicon oxynitride. The insulating layer 1140 is preferably formed of an organic insulating material such as an acrylic resin or a polyimide resin or a material including a siloxane bond. A layer including the transistors 1451, 1452, 1453 and 1454, memory elements 1356*a* and 1356*b*, the conductive layer 1353 functioning as an antenna, and the like over the base insulating layer 1104 is called an element layer 1141.

Next, the element layer 1141 is peeled from the substrate 1100. For example, openings 1142 and 1144 are formed by laser beam irradiation (e. g. UV light) (see FIG. 13B), and then, the element layer 1141 can be peeled from the substrate 1100 by using physical force (see FIG. 13B). Alternatively, before the element layer 1141 is peeled from the substrate 1100, an etchant may be introduced into the openings 1142 and 1144 to remove the separation layer 1102. As the etchant, a gas or a liquid containing halogen fluoride or an interhalogen compound is used; for example, chlorine trifluoride (ClF$_3$) is used as a gas containing halogen fluoride. Accordingly, the element layer 1141 is peeled from the substrate 1100. Note that the separation layer 1002 may be partially left instead of being removed entirely. By leaving a part of the separation layer 1102, consumption of the etchant can be reduced and time for removing the separation layer can be shortened. In addition, the element layer 1141 can be retained over the substrate 1100 even after the separation layer 1102 is removed. For cost reduction, it is preferable to reuse the substrate 1100 after the element layer 1141 is peeled off.

Next, one surface of the element layer 1141 is attached to a first base 1146, and then the element layer 1141 is completely peeled from the substrate 1100. Then, the other surface of the element layer 1141 is attached to a second base 1148, and then one or both of heat treatment and pressure treatment is/are conducted to seal the element layer 1141 with the first base 1146 and the second base 1148 (see FIG. 14). Each of the first base 1146 and the second base 1148 corresponds to a film having a thermoplastic property (formed of polyolefin, polyolefin containing fluorine, polyester, or the like), paper formed of a fibrous material, a layered film of a base film (formed of polyester, polyamide, an inorganic vapor deposition film, paper, or the like) and an adhesive synthetic resin film (formed of acrylic-based synthetic resin, epoxy-based synthetic resin, or the like), or the like.

The film is attached to an object to be processed by conducting heat treatment and pressure treatment. The treatments are performed in the following manner: an adhesive layer which is provided on the outermost surface of the film or a layer (not an adhesive layer) which is provided on the outermost layer thereof is melted by the heat treatment, and then pressure is applied, thereby attaching the film. An adhesive layer may be provided on a surface of the first base 1146 and the second base 1148, but is not necessarily provided. The adhesive layer corresponds to a layer containing an adhesive such as a heat curable resin, an ultraviolet-curable resin, an epoxy resin-based adhesive or a resin additive.

Through the above process, a semiconductor device including a memory element of the present invention and an antenna can be manufactured. This embodiment mode can be freely implemented in combination with any of the above embodiment modes.

According to the present invention, initial defects of a memory element can be reduced and yield in manufacturing a semiconductor device including the memory element can be improved.

In addition, according to the present invention, it is possible to provide a semiconductor device including a memory element in which writing at a time other than a manufacturing process (additional recording) of data is possible and forgery caused by rewriting of data can be prevented.

Further, the semiconductor device of this embodiment mode includes a memory element and an antenna and can conduct data communication without contact. Moreover, through the above-described process, a flexible semiconductor device can be obtained.

Figure 14:
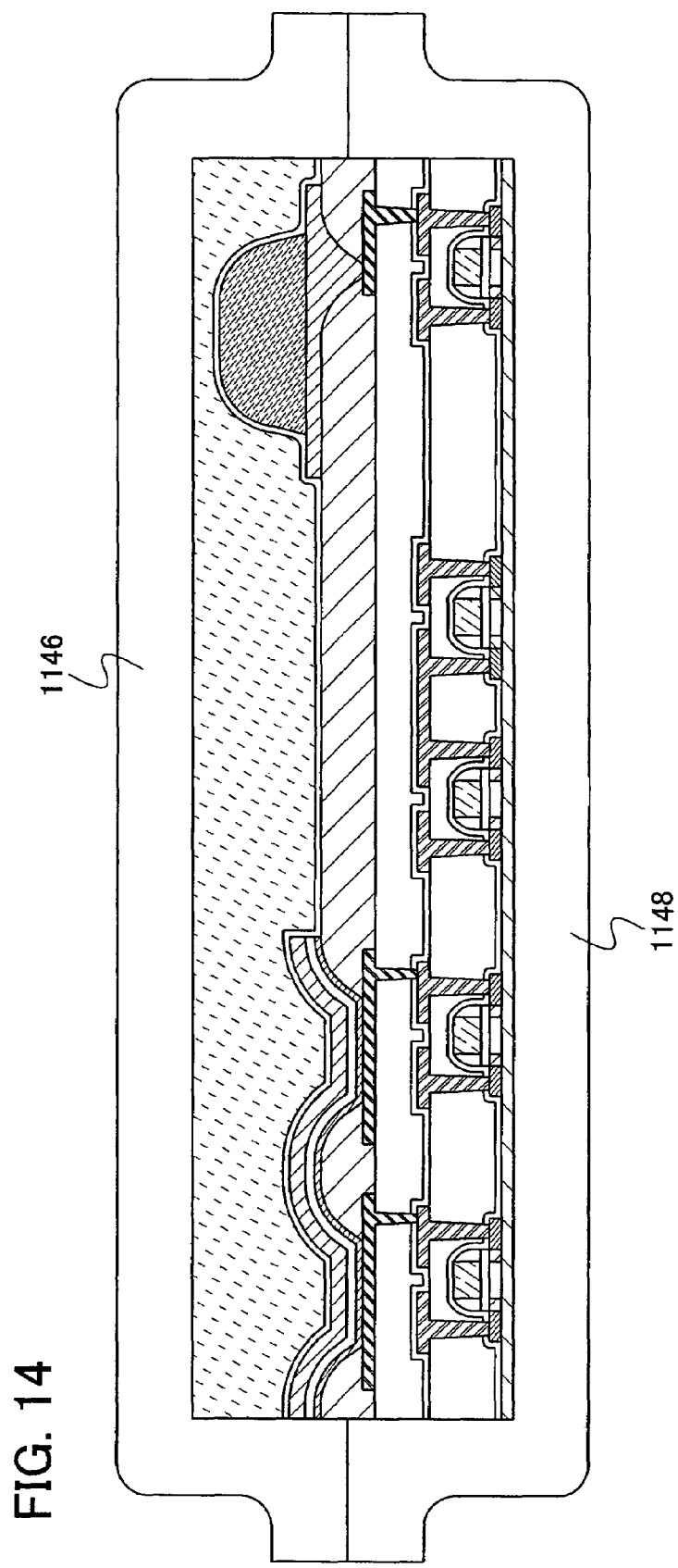
FIG. 14 shows an example of a manufacturing method of a semiconductor device of the present invention.
Figure 15A:
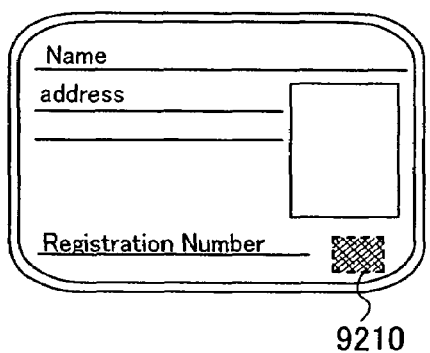
FIGS. 15A to 15F show examples of a semiconductor device of the present invention.
Figure 15B:
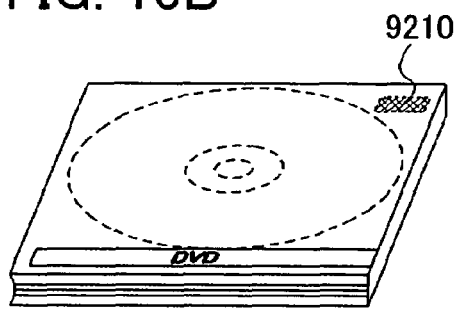
Figure 15C:
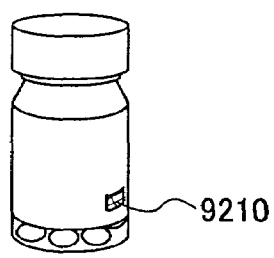
Figure 15D:
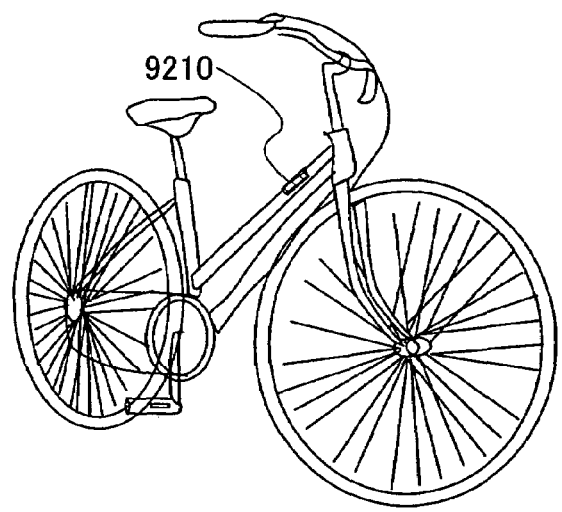
Figure 15E:
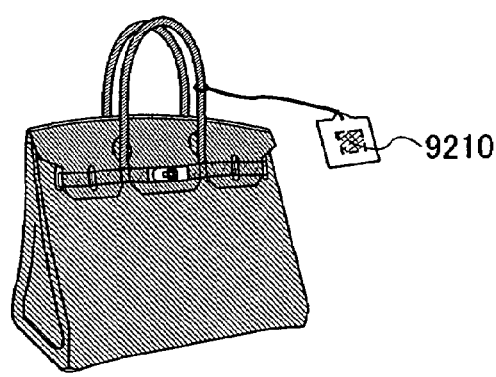
Figure 15F:
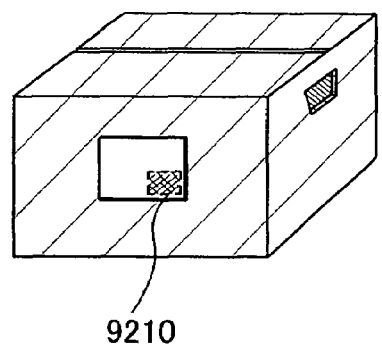
Figure 16:
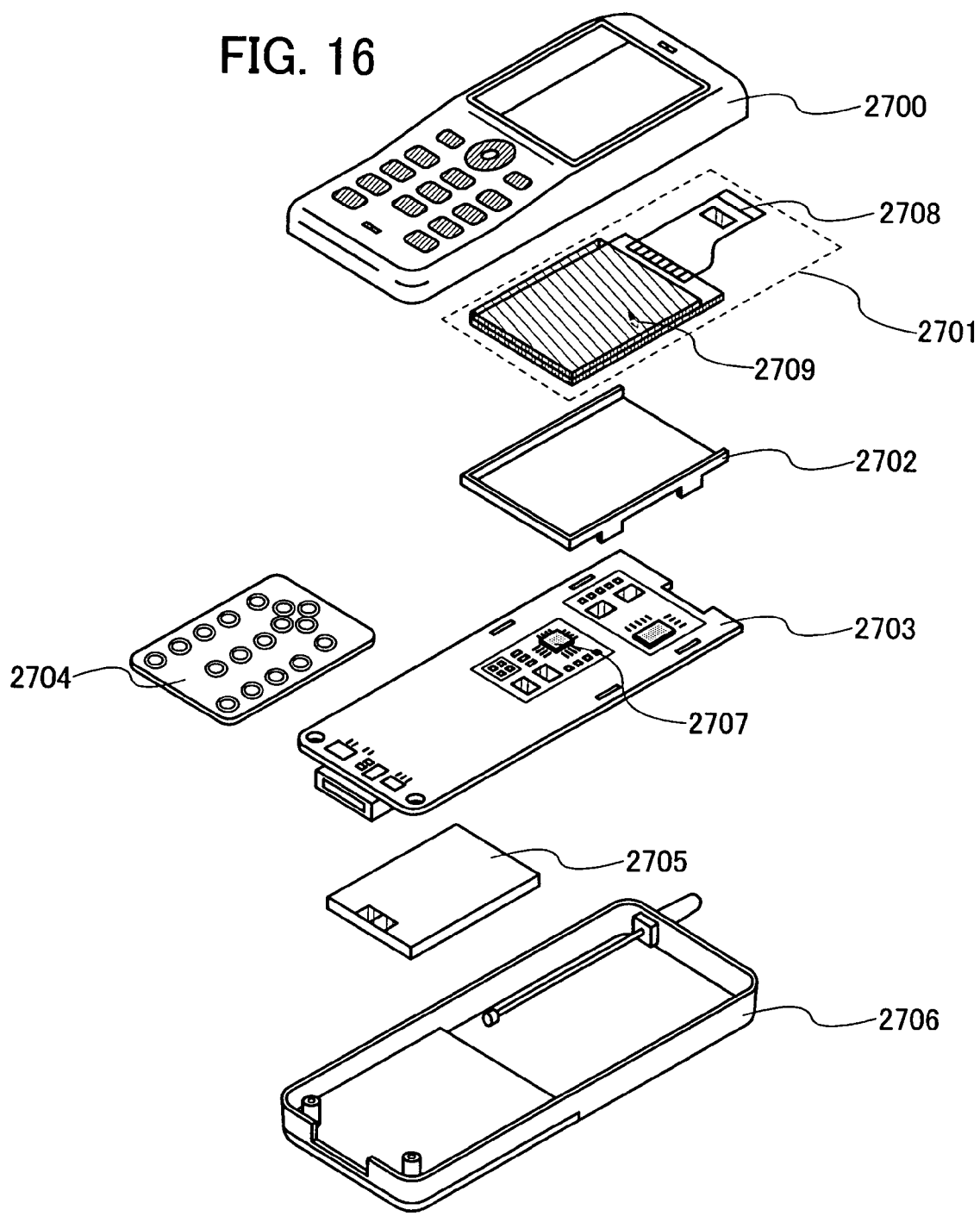
FIG. 16 shows an example of a semiconductor device of the present invention.

Next, examples of applying a semiconductor device of the present invention capable of reading and writing data without contact as shown in FIG. 14 to a wireless chip will be described with reference to FIGS. 15A to 16.

A wireless chip 9210 using the semiconductor device of the present invention can be used in various fields. For example, the wireless chip can be applied to paper money, coins, securities, bearer bonds, identification certificates (driver's license, certificate of residence, and the like, see FIG. 15A), containers for package (package paper, bottles, and the like, see FIG. 15C), recording media (DVD software, video tapes, and the like, see FIG. 15B), vehicles (bicycles and the like, see FIG. 15D), personal belongings (bags, glasses, and the like), foods, plants, clothes, commodities, electronic appliances, baggage tags (see FIGS. 15E and 15F), and the like. Further, the wireless chip can be attached to or embedded into animals or human bodies. The electronic appliances include a liquid crystal display device, an EL (Electro Luminescence) display device, a television device (also referred to as simply a TV, a TV receiving machine or a television receiving machine), a mobile phone, and the like.

The semiconductor device of the present invention can be fixed to a product by being mounted on a printed substrate, being attached to a surface of the product, or being embedded in the product. For example, if the product is a book, the semiconductor device can be fixed to the book by embedding it in a paper, and if the product is a package made of an organic resin, the semiconductor device can be fixed to the package by embedding it in the organic resin. Since the semiconductor device of the present invention can be small, thin and lightweight, the design quality of the product itself is not degraded even after the semiconductor device is fixed to the product. By providing the semiconductor device to paper money, coins, securities, bearer bonds, identification certificates, and the like, an identification function can be provided and the forgery can be prevented by using this identification function. Moreover, when the semiconductor device of the present invention is provided for containers for package, recording media, personal belongings, foods, clothes, commodities, electronic appliances, and the like, the efficiency of systems such as an, inspection system can be improved.

Next, an aspect of an electronic appliance with a semiconductor device of the present invention mounted will be described with reference to a drawing. An electronic appliance exemplified here is a mobile phone, which includes a case 2700, a case 2706, a panel 2701, a housing 2702, a printed wiring substrate 2703, operation buttons 2704 and a battery 2705 (see FIG. 16). The panel 2701 is detachably incorporated in the housing 2702, and the housing 2702 is fitted into the printed wiring substrate 2703. The shape and size of the housing 2702 is appropriately modified in accordance with an electronic appliance to which the panel 2701 is to be incorporated. The printed wiring substrate 2703 has a plurality of packaged semiconductor devices mounted. A semiconductor device of the present invention can be used as one of the packaged semiconductor devices. The plurality of semiconductor devices mounted on the printed wiring substrate 2703 have any function of a controller, a central processing unit (CPU), a memory, a power source circuit, an audio processing circuit, a sending/receiving circuit, and the like.

The panel 2701 is connected to the printed wiring substrate 2703 via a connection film 2708. The panel 2701, the housing 2702 and the printed wiring substrate 2703 are included inside the cases 2700 and 2706 together with the operation buttons 2704 and the battery 2705. A pixel region 2709 in the panel 2701 is provided so as to be observed from an opening window of the case 2700.

As aforementioned, the semiconductor device of the present invention has features of being small, thin and light-weight. These features allow efficient usage of limited space in the cases 2700 and 2706 of the electronic appliance.

Since the semiconductor device of the present invention includes a memory element having a simple structure where an organic compound layer which is changed by application of voltage from the outside and a layer containing a compound which can exhibit liquid crystallinity in which phase transition occurs by the application of voltage from the outside are interposed between a pair of conductive layers, an electronic appliance using an inexpensive semiconductor device can be provided. Further, since the semiconductor device of the present invention can be highly integrated easily, an electronic appliance using a semiconductor device including a large-capacity memory circuit can be provided.

The memory element included in the semiconductor device of the present invention has features that data writing is conducted by application of voltage from the outside, the memory element is nonvolatile, and additional recording of data is possible. By the features, forgery caused by rewriting of data can be prevented, and new data can be additionally written. Accordingly, an electronic appliance using the highly-functional and high value-added semiconductor device can be provided.

The cases 2700 and 2706 are only examples of the exterior shape of the mobile phone, and electronic appliances of this embodiment mode may be varied in accordance with its function and intended use.

This application is based on Japanese Patent Application serial No. 2006-125238 filed in Japan Patent Office on Apr. 28, 2006, the entire contents of which are hereby incorporated by reference.

What is claimed is:

1. A memory element comprising:
    a first conductive layer;
    a second conductive layer;
    a layer comprising a compound which can exhibit liquid crystallinity, which is interposed between the first conductive layer and the second conductive layer; and
    a layer comprising an organic compound, which is interposed between the layer comprising a compound which can exhibit liquid crystallinity and the second conductive layer, wherein:
    the layer comprising the compound which can exhibit liquid crystallinity is in contact with the first conductive layer, and
    the layer comprising an organic compound is in contact with the layer comprising the compound which can exhibit liquid crystallinity.

2. The memory element according to claim 1, wherein the layer comprising a compound which can exhibit liquid crystallinity is a layer in which phase transition at least from a first phase to a second phase is generated.

3. The memory element according to claim 2, wherein
    the first phase of the layer comprising the compound which can exhibit liquid crystallinity is a solid state, and the second phase is a liquid crystal state or a liquid state.

4. The memory element according to claim 2, wherein the phase transition of the layer comprising the compound which can exhibit liquid crystallinity from the first phase to the second phase is generated by temperature change caused by application of voltage between the first conductive layer and the second conductive layer.

5. The memory element according to claim 1, wherein the layer comprising the organic compound is a layer comprising an organic resin, a layer comprising an organic compound having a hole transporting property, or a layer comprising an organic compound having an electron transporting property.

6. The memory element according to claim 1, wherein at least one of the first conductive layer and the second conductive layer comprises at least one kind of an element selected from the group consisting of gold, silver, platinum, nickel, tungsten, chromium, molybdenum, iron, cobalt, copper, palladium, carbon, aluminum, manganese, titanium or tantalum and an alloy comprising the element.

7. The memory element according to claim 1, wherein at least one of the first conductive layer and the second conductive layer comprises at least one kind of an element selected from the group consisting of lithium, cesium, magnesium, calcium, strontium, ytterbium and an alloy comprising the element.

8. The memory element according to claim 1, wherein at least one of the first conductive layer and the second conductive layer comprises indium tin oxide, zinc oxide, indium zinc oxide, zinc oxide to which gallium is added, or indium tin oxide including silicon oxide.

9. A semiconductor device comprising:
    a memory cell array in which a plurality of memory cells are provided in matrix;
    a writing circuit which selects at least one of the plurality of memory cells and writes data thereto; and
    a reading circuit which selects at least one of the plurality of memory cells and reads data therefrom,
    wherein:
    a memory element is provided in at least one of the plurality of memory cells, and
    the memory element comprises:
        a first conductive layer;
        a second conductive layer;
        a layer comprising a compound which can exhibit liquid crystallinity which is interposed between the first conductive layer and the second conductive layer,
        a layer comprising an organic compound which is interposed between the layer comprising a compound which can exhibit liquid crystallinity and the second conductive layer,
    wherein:
    the layer comprising a compound which can exhibit liquid crystallinity is in contact with the first conductive layer, and
    the layer comprising an organic compound is in contact with the layer comprising the compound which can exhibit liquid crystallinity.

10. The semiconductor device according to claim 9, wherein the memory element further comprises a transistor connected to the memory element.

11. The semiconductor device according to claim 9, wherein the layer comprising the compound which can exhibit liquid crystallinity is a layer in which phase transition from a solid state to a liquid state or a liquid crystal state by temperature change is generated by application of voltage between the first conductive layer and the second conductive layer.

12. The semiconductor device according to claim 9, wherein the layer comprising the organic compound comprises an organic resin, an organic compound having a hole transporting property, or an organic compound having an electron transporting property.

13. The semiconductor device according to claim 9, wherein the memory cell array, the writing circuit for writing the data, and the reading circuit for reading the data are provided over a glass substrate.

* * * * *